(12) United States Patent
Becker et al.

(10) Patent No.: US 7,723,455 B2
(45) Date of Patent: May 25, 2010

(54) CONJUGATED POLYMERS CONTAINING DIHYDROPHENANTHRENE UNITS AND USE THEREOF

(75) Inventors: Heinrich Becker, Hofheim (DE); Esther Breuning, Niedernhausen (DE); Arne Büsing, Frankfurt am Main (DE); Aurélie Ludemann, Frankfurt (DE); Corinna Leske, Frankfurt (DE); Hubert Spreitzer, Viernheim (DE); Silke Türk, Montabaur (DE)

(73) Assignee: Merck Patent GmbH (DE)

( * ) Notice: Subject to any disclaimer, the term of this patent is extended or adjusted under 35 U.S.C. 154(b) by 166 days.

(21) Appl. No.: 10/568,167

(22) PCT Filed: Aug. 12, 2004

(86) PCT No.: PCT/EP2004/009019

§ 371 (c)(1),
(2), (4) Date: May 10, 2006

(87) PCT Pub. No.: WO2005/014689

PCT Pub. Date: Feb. 17, 2005

(65) Prior Publication Data

US 2007/0060736 A1 Mar. 15, 2007

(30) Foreign Application Priority Data

Aug. 12, 2003 (DE) ................. 103 37 346

(51) Int. Cl.
*C08G 79/08* (2006.01)
(52) U.S. Cl. ............................. 528/8; 528/4
(58) Field of Classification Search ............ 528/86, 528/4, 8
See application file for complete search history.

(56) References Cited

U.S. PATENT DOCUMENTS

| 4,013,713 | A | * | 3/1977 | Weber et al. ............ 562/87 |
| 4,421,670 | A | * | 12/1983 | Deutscher et al. ....... 252/299.62 |
| 4,758,639 | A | * | 7/1988 | Koyanagi et al. ........... 526/62 |
| 5,189,065 | A | * | 2/1993 | Czech et al. ............... 514/656 |
| 5,213,709 | A | * | 5/1993 | Takiguchi et al. ....... 252/299.61 |
| 5,401,794 | A | * | 3/1995 | Ash ........................... 524/485 |
| 5,648,021 | A | * | 7/1997 | Wingen et al. .......... 252/299.62 |
| 5,728,480 | A | * | 3/1998 | Stern et al. .................. 428/690 |
| 5,997,874 | A | * | 12/1999 | Kubo et al. ................. 424/773 |
| 6,124,421 | A | * | 9/2000 | Lau et al. ..................... 528/169 |
| 6,168,838 | B1 | * | 1/2001 | Schmidt et al. ............... 428/1.1 |
| 6,303,250 | B1 | * | 10/2001 | Watanabe et al. .......... 429/306 |
| 6,414,104 | B1 | * | 7/2002 | Pei ............................... 528/86 |
| 6,495,220 | B2 | * | 12/2002 | Dubal et al. ................. 428/1.1 |
| 6,555,279 | B2 | * | 4/2003 | Nakata et al. ................. 430/66 |
| 6,716,955 | B2 | * | 4/2004 | Burgoyne, Jr. ............... 528/86 |
| 6,984,459 | B1 | * | 1/2006 | Noguchi et al. ............. 428/690 |
| 7,067,179 | B1 | * | 6/2006 | Ogawa et al. ................ 428/1.1 |
| 2004/0062930 | A1 | * | 4/2004 | Roberts et al. ............. 428/411.1 |
| 2004/0214036 | A1 | * | 10/2004 | Bentsen et al. ............. 428/690 |
| 2005/0176952 | A1 | * | 8/2005 | Tuan et al. ................... 540/106 |
| 2006/0149022 | A1 | * | 7/2006 | Parham et al. .............. 528/102 |
| 2006/0177603 | A1 | * | 8/2006 | Taugerbeck et al. .......... 428/1.1 |
| 2006/0284140 | A1 | * | 12/2006 | Breuning et al. ........ 252/301.35 |

FOREIGN PATENT DOCUMENTS

EP 1 074 600 A2 2/2001
EP 1 329 474 A1 7/2003

OTHER PUBLICATIONS

Baldo et al, Applied Physics Letters, 75(1), 1999, 4-6.*
Uckert, F., "Neue Lösliche Poly(para-phenylen)-Derivate mit Überbrückten Biphenyl-Untereinheiten-Synthese und Anwendung in blauen Leuchtdioden," Dissertation, 1-210 (1998).

* cited by examiner

*Primary Examiner*—Mark Eashoo
*Assistant Examiner*—Liam J Heincer
(74) *Attorney, Agent, or Firm*—Connelly Bove Lodge + Hutz LLP

(57) ABSTRACT

The invention relates to conjugated polymers containing novel structural units according to formula (1). The inventive materials are characterized by increased efficiency and a longer service life when used in polymer organic light emitting diodes.

26 Claims, No Drawings

CONJUGATED POLYMERS CONTAINING DIHYDROPHENANTHRENE UNITS AND USE THEREOF

RELATED APPLICATIONS

This application is the U.S. National Stage of International Application No. PCT/EP2004/009019, filed Aug. 12, 2004, published in German, and claims priority under 35 U.S.C. §365 to German Application No. 103 37 346.2, filed Aug. 12, 2003.

Wide-ranging research on the commercialization of display and lighting-elements based on polymeric (organic) light-emitting diodes (PLEDs) has been conducted for about 12 years. This development was triggered by the fundamental developments disclosed in EP 423 283 (WO 90/13148). Recently, a first, albeit simple, product (a small display in a shaver from PHILIPS N.V.) has also become available on the market. However, significant improvements are still necessary to make these displays genuinely competitive with or superior to the liquid crystal displays (LCDs) which currently dominate the market. In particular, it is necessary to provide polymers for all emission colors (red, green, blue) which satisfy the requirements of the market (color saturation, efficiency, operating life, to name the most important).

Various classes of materials have been proposed or developed as polymers for full-color displays. Thus, polyfluorene derivatives as disclosed, for example, in EP 0842208, WO 99/54385, WO 00/22027, WO 00/22026 and WO 00/46321, are possibilities. Furthermore, polyspirobifluorene derivatives as disclosed in EP 0707020, EP 0894107 and WO 03/020790 are also possible. Polymers comprising a combination of the two abovementioned structural elements, as disclosed in WO 02/077060 have also been proposed. In general, polymers containing poly-para-phenylene (PPP) as structural element are possible for such use. Apart from the abovementioned classes, further possible polymers are, for example, "ladder PPPs" (LPPPs) (e.g. as described in WO 92/18552), polytetrahydropyrenes (e.g. as described in EP 699699) and also PPPs comprising ansa structures (e.g. as described in EP 690086).

As has already been discovered in some of the abovementioned patent applications, it is necessary to copolymerize particular comonomers into the appropriate polymers in order to produce all three emission colors (cf., for example, WO 00/46321, WO 03/020790 and WO 02/077060). Starting from a blue-emitting base polymer (backbone), it is then generally possible to produce the two other primary colors red and green.

The general structure of PLEDs is described in the abovementioned patent applications or patents and is also explained in more detail below.

At present, the commercialization of both single-color and also multicolor or full-color displays based on PLEDs is being considered. While single-color displays may be able to be produced by means of simple coating technologies (e.g. doctor blade coating, spin coating), the use of printing processes (e.g. ink jet printing, offset printing, gravure printing, screen printing) will very probably be necessary for multi-color or full-color display elements. All these processes require soluble polymers.

Some of the polymers described in the abovementioned patent applications have good properties for the applications mentioned. Important properties are, first and foremost, the following:

High luminous and energy efficiency when used in PLEDs.
Long operating life when used in PLEDs.
Low operating voltage.
Good storage stability, both during use in PLEDs and also before introduction into appropriate devices.
Good solubility in organic solvents to make an appropriate coating process possible at all.
Sensible availability to make economical use in mass-produced products possible.
Achievability of various colors to make full-color displays possible.

It has now surprisingly been found that a new class of polymers comprising substituted dihydrophenanthrene units displays very good properties which are superior to the abovementioned prior art. These polymers and their use in PLEDs are therefore subject matter of the present invention.

Unsubstituted poly(dihydrophenanthrenes) have been described in JP 04288322 and by T. Yamamoto et al. (*Macromolecules* 1992, 25, 1214-1223). However, due to the lack of substituents in the 9,10 positions and also on the aromatic, these polymers do not represent alternatives to polymers according to the invention since the unsubstituted polymers are insoluble and thus cannot be processed from solution. Likewise, F. Uckert (thesis, University of Mainz 1998) describes the synthesis of oligo(9,9,10,10-tetramethyl-9,10-dihydrophenanthrene). However, the synthesis of polymers from these building blocks was, owing to the low solubility, no more possible than a test of the oligomers in a PLED. The same study describes the synthesis of poly[9,10-dimethyl-9,10-bis(pivaloyloxy)-9,10-dihydrophenanthrene]. Although this is relatively soluble and in principle displays blue electroluminescence, the energy consumption in a PLED comprising this material is too high because of the high operating voltage and the life is too short, so that this substituent combination is not suitable for the synthesis of highly efficient and long-lived polymers.

EP 1074600 describes alternating poly(arylene-vinylene) compounds in which one arylene unit is a 9,10-dialkyl-9,10-dihydrophenanthrene and the other is a substituted phenylene. Properties of this polymer, in particular the electroluminescence, are not described, so that this example does not indicate any specific advantages of this polymer.

The invention provides polymers comprising at least 1 mol %, preferably at-least 10 mol %, particularly preferably at least 40 mol %, of units of the formula (I),

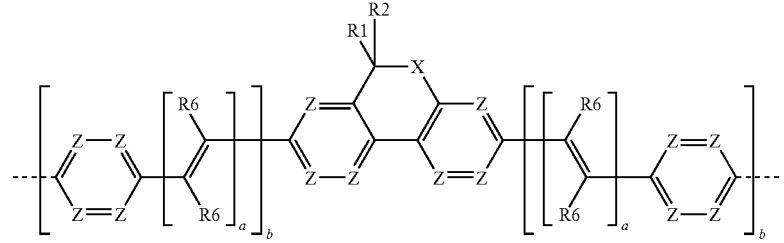

FORMEL (I)

[FORMULA (I)]

where the symbols and indices used have the following meanings:

X is identical or different on each occurrence and is in each case C(R3)(R4) or N(R3);

Z is identical or different on each occurrence and is in each case C(R5) or N;

R1, R2, R3, R4 are identical or different on each occurrence and are in each case H, fluorine, chlorine, bromine, iodine, CN, $N(R6)_2$, $Si(R6)_3$ or $B(R6)_2$, a straight-chain, branched or cyclic alkyl or alkoxy chain having from 1 to 22 carbon atoms in which one or more nonadjacent carbon atoms may also be replaced by NR6, O, S, O—CO—O, CONR6, $Si(R6)_2$, where one or more H atoms may also be replaced by fluorine, an aryl, heteroaryl or aryloxy group having from 5 to 40 carbon atoms in which one or more carbon atoms may also be replaced by O, S or N and which may also be substituted by one or more nonaromatic radicals R1, with two or more of the radicals R1 to R4 also being able to be joined to form a ring system; with the proviso that two substituents on one carbon atom (i.e. R1 and R2 or R3 and R4) are not at the same time an alkoxy or aryloxy side chain and that all substituents R1 to R4 are not at the same time H or not at the same time a methyl group;

R5 is identical or different on each occurrence and is in each case H, F, CN, $N(R6)_2$ or $B(R6)_2$, a straight-chain, branched or cyclic alkyl or alkoxy chain having from 1 to 22 carbon atoms in which one or more nonadjacent carbon atoms may also be replaced by O, S, CO—O, O—CO—O, CONR6, $Si(R6)_2$, where one or more H atoms may also be replaced by fluorine, an aryl, heteroaryl or aryloxy group having from 5 to 40 carbon atoms in which one or more carbon atoms may also be replaced by O, S or N and which may also be substituted by one or more nonaromatic radicals R5; with a plurality of radicals R5 with one another or together with R1 to R4 also being able to form a ring system;

R6 is identical or different on each occurrence and is in each case H, a straight-chain, branched or cyclic alkyl chain having from 1 to 22 carbon atoms in which one or more nonadjacent carbon atoms may also be replaced by O, S, CO—O, O—CO—O, where one or more H atoms may also be replaced by fluorine, an aryl group having from 5 to 40 carbon atoms in which one or more carbon atoms may also be replaced by O, S or N and which may also be substituted by one or more nonaromatic radicals R6;

a is identical or different on each occurrence and is in each case 0 or 1;

b is identical or different on each occurrence and is in each case 0, 1 or 2;

with the proviso that poly(arylene-vinylene) compounds in which one arylene unit is a 9,10-dialkyl-9,10-dihydrophenanthrene are excluded from the invention; where the bond shown as a broken line in the formula (I) as in all further formulae indicates the linkage in the polymer and should not be a methyl group here.

Even though this is indicated by the description, it will at this point once more be explicitly stated that the structural units of the formula (I) can also be unsymmetrically substituted, i.e. different substituents R1 to R5 can be present on one unit or R5 can also be located in different positions on the two sides of the biaryl. Likewise, it will once more be explicitly stated that the radicals R1 to R5 can together also form a ring system.

In a preferred embodiment of the invention, X=C(R3)(R4), as shown in formula (Ia):

FORMULA (Ia)

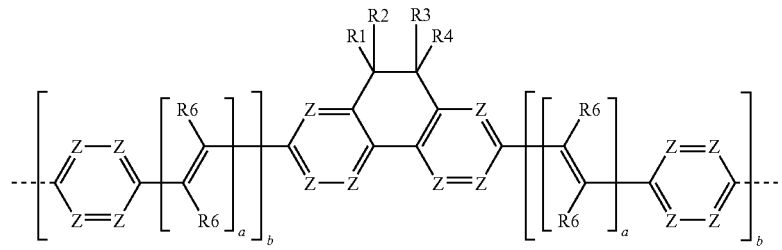

Here, the further symbols used have the same meanings as described above under formula (I).

In a particularly preferred embodiment of the invention, X=C(R3)(R4) and Z=C(R5), as shown in formula (Ib):

FORMULA (Ib)

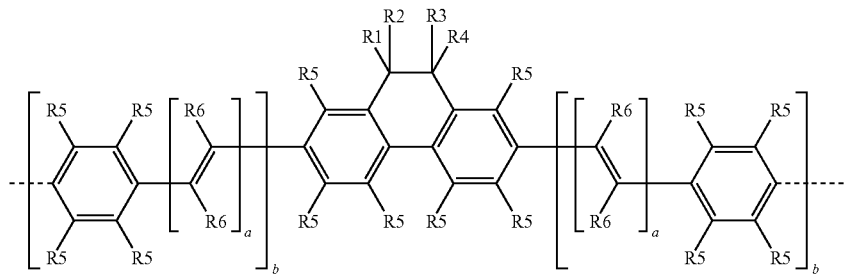

Here, the further symbols used have the same meanings as described above under formula (I).

The polymers can be conjugated, partially conjugated or nonconjugated. In a preferred embodiment of the invention, the polymers are conjugated or partially conjugated; in a particularly preferred embodiment of the invention, the polymers are conjugated.

For the purposes of the present invention, conjugated polymers are polymers which comprise mainly sp²-hybridized carbon atoms, which may also be replaced by corresponding heteroatoms, in the main chain. In the simplest case, this means the alternating presence of double and single bonds in the main chain. "Mainly" means that naturally occurring defects which lead to interruptions to conjugation do not invalidate the term "conjugated polymers". Furthermore, polymers are likewise referred to as conjugated in this patent application text if, for example, arylamine units and/or particular heterocycles (i.e. conjugation via N, O or S atoms) and/or organic metal complexes (i.e. conjugation via the metal atom) are present in the main chain.

For the purposes of the present invention, partially conjugated polymers are polymers which either have relatively long conjugated sections which are interrupted by nonconjugated sections in the main chain or have relatively long conjugated sections in the side chains of a polymer which is nonconjugated in the main chain. On the other hand, units such as simple (thio)ether bridges, alkylene chains, ester, amide or imide linkages are unambiguously defined as non-conjugated segments.

The polymers of the invention can further comprise additional structural elements in addition to the units of the formula (I). These are, inter alia, those which have been disclosed in the abovementioned patent applications. Reference may at this point also be made to the relatively comprehensive listing in the patent application WO 02/077060 mentioned above; this is incorporated by reference into the present invention. These further structural units can, for example, come from the classes described below:

Group 1: units which significantly improve the hole injection and/or transport properties of the polymers;
Group 2: units which significantly improve the electron injection and/or transport properties of the polymers;
Group 3: units which comprise combinations of individual units of group 1 and group 2;
Group 4: units which alter the emission characteristics so that phosphorescence rather than fluorescence can be obtained;
Group 5: units which aid the transition from the singlet state to the triplet state;
Group 6: units which influence the morphology or the emission color of the resulting polymers;
Group 7: units which are typically used as backbone.

Preferred polymers according to the invention are those in which at least one structural element has charge transport properties, i.e. which comprise the units of groups 1 and/or 2. For the purposes of the present patent application, such structural elements have the following characteristics: if these structural elements were to be used to produce homopolymers or homooligomers, these would have a significantly higher charge carrier mobility for at least one charge carrier, i.e. either electrons or holes, than is the case for a polymer consisting exclusively of structural elements of the formula (I). The charge carrier mobility (measured in $cm^2/(V*s)$) is preferably higher by a factor of at least 10, particularly preferably by a factor of at least 50.

Structural elements from group 1, which have hole transport properties, are, for example, triarylamine derivatives, benzidine derivatives, tetraarylene-para-phenylenediamine derivatives, phenothiazine derivatives, phenoxazine derivatives, dihydrophenazine derivatives, thianthrene derivatives, dibenzo-p-dioxin derivatives, phenoxathiine derivatives, carbazole derivatives, azulene derivatives, thiophene derivatives, pyrrole derivatives, furan derivatives and further O—, S— or N-containing heterocycles having a high HOMO (HOMO=highest occupied molecular orbital); these arylamines and heterocycles preferably lead to a HOMO in the polymer of less than 5.8 eV (relative to vacuum level), particularly preferably less than 5.5 eV.

Preferred units of group 1 are units of the formulae (II) to (XX),

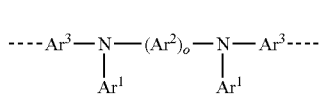
Formula (II)

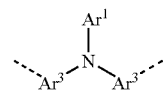
Formula (III)

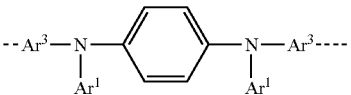
Formula (IV)

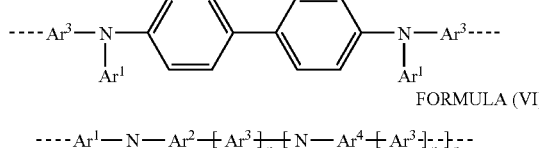
Formula (V)

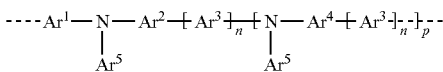
FORMULA (VI)

Formula (VII)

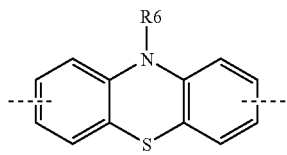
Formula (VIII)

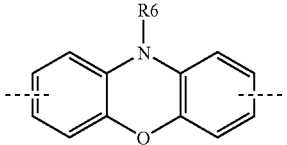
Formula (IX)

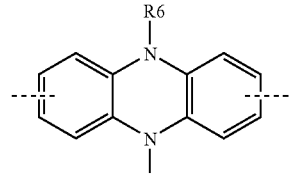
Formula (X)

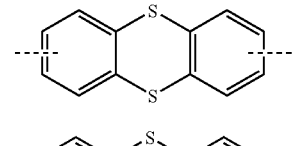
Formula (XI)

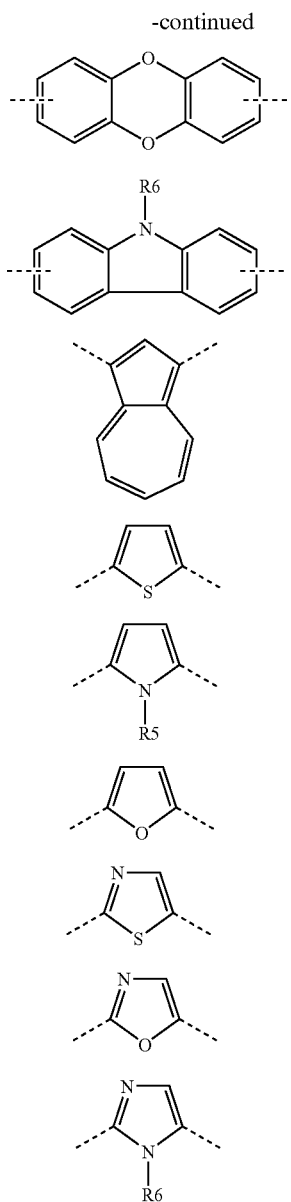

Formula (XII)

Formula (XIII)

Formula (XIV)

Formula (XV)

Formula (XVI)

Formula (XVII)

Formula (XVIII)

Formula (XIX)

Formula (XX)

[replace Formel by formula]

where the substituents R1 to R6 are as defined above, the various formulae can be substituted in the free positions by substituents R1 and the symbols and indices have the following meanings:

n is identical or different on each occurrence and is in each case 0, 1 or 2;

p is identical or different on each occurrence and is in each case 0, 1 or 2, preferably 0 or 1;

o is identical or different on each occurrence and is in each case 1, 2 or 3, preferably 1 or 2;

$Ar^1$, $Ar^3$ are identical or different on each occurrence and are each an aromatic or heteroaromatic ring system which has from 2 to 40 carbon atoms and may be substituted or unsubstituted, with the possible substituents R1 potentially being able to be located on any free position;

$Ar^2$, $Ar^4$ are identical or different on each occurrence and are each as defined for $Ar^1$, $Ar^3$ or a substituted or unsubstituted stilbenylene or tolanylene unit;

$Ar^5$ is identical or different on each occurrence and is in each case either a system as defined for $Ar^1$ or an aromatic or heteroaromatic ring system which has from 9 to 40 aromatic atoms (carbon atoms or heteroatoms) and may be substituted or unsubstituted and comprises at least two fused rings; with the possible substituents R1 potentially being able to be located on any free position.

Structural elements from group 2, which have electron transport properties, are, for example, pyridine derivatives, pyrimidine derivatives, pyridazine derivatives, pyrazine derivatives, anthracene derivatives, triarylboranes, oxadiazole derivatives, quinoline derivatives, quinoxaline derivatives, phenazine derivatives, arylboranes and further O—, S— or N-containing heterocycles having a, low LUMO (LUMO=lowest unoccupied molecular orbital); these heterocycles preferably lead to a LUMO in the polymer of more than 2.7 eV (relative to vacuum level), particularly preferably more than 3.0 eV.

Preferred units of group 2 are units of the formulae (XXI) to (XXXII),

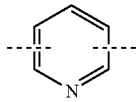

formula (XXI)

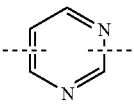

formula (XXII)

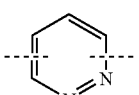

formula (XXIII)

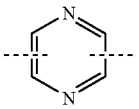

formula (XXIV)

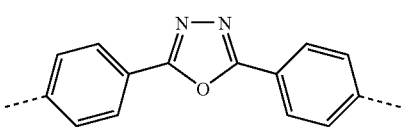

formula (XXV)

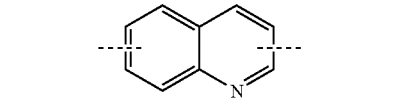

formula (XXVI)

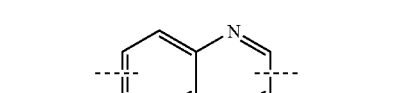

formula (XXVII)

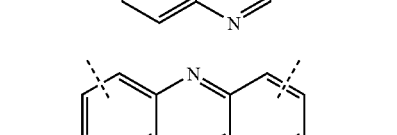

formula (XXVIII)

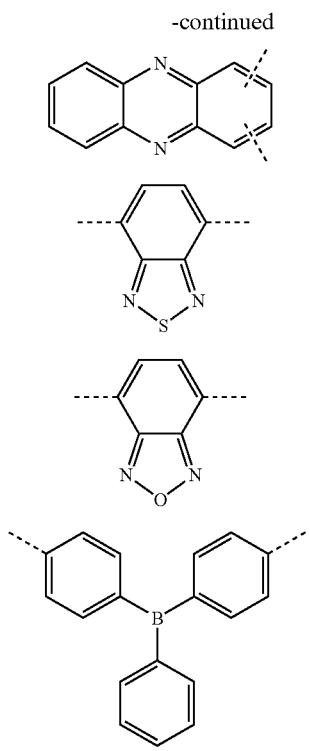

formula (XXIX)

formula (XXX)

formula (XXXI)

formula (XXXII)

where the various formulae may be substituted in the free positions by substituents R1.

It can be preferred for units from group 3 in which units which increase hole mobility and units which increase electron mobility are bound directly to one another to be present in the polymers of the invention. Such units are, inter alia, units of the formulae (XXXIII) to (XXXXVII) or more generally the formula (XXXXVIII), which comprise both one or more structures of the formulae (II) to (XX) and one or more structures of the formulae (XXI) to (XXXII), with the various formulae being able to be substituted in the free positions by substituents R1 and the symbols R1, R2, R3, R4, R5, Ar¹ and the indices n, p and o being as defined above and Y being identical or different on each occurrence and in each case being O, S, Se, N, P, Si or Ge. However, it may be pointed out that it is naturally a simple task for a person skilled in the art to synthesize further suitable combinations from the above-mentioned structures (II) to (XX) or (XXI) to (XXXII) and incorporate these into the polymers of the invention.

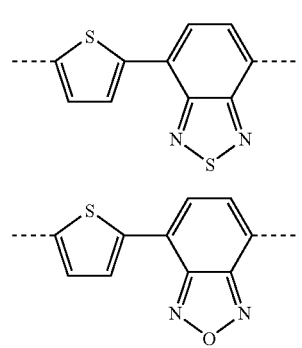

formula (XXXIII)

formula (XXXIV)

formula (XXXV)

formula (XXXVI)

formula (XXXVII)

formula (XXXVIII)

formula (XXXIX)

formula (XXXX)

formula (XXXXI)

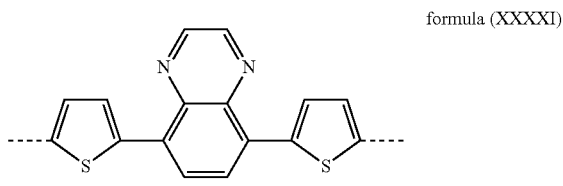

-continued

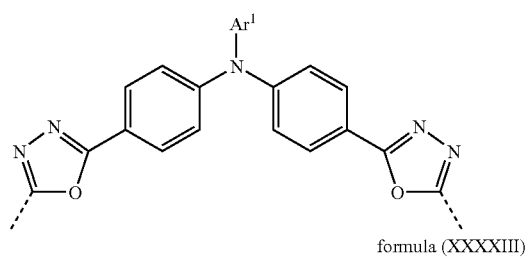
formula (XXXXII)

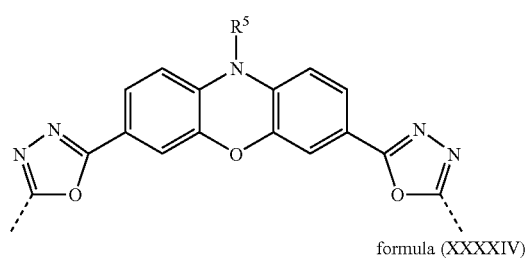
formula (XXXXIII)

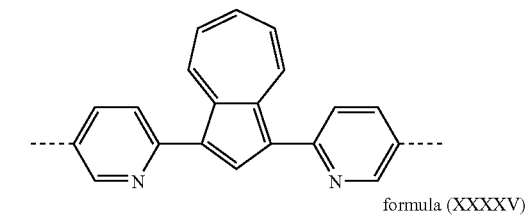
formula (XXXXIV)

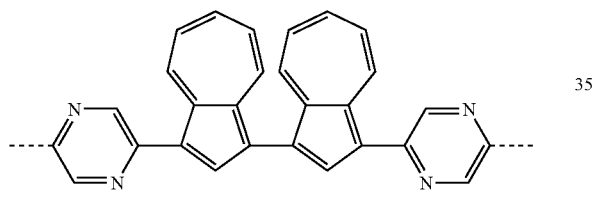
formula (XXXXV)

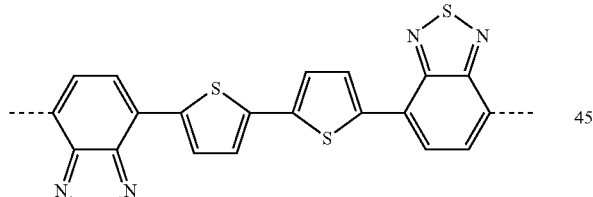
formula (XXXXVI)

formula (XXXXVII)

formula (XXXXVIII)

Structural units of group 4 are ones which make a transfer from singlet excitons to triplet excitons possible and can emit light with high efficiency from the triplet state even at room temperature, i.e. display electrophosphorescence rather than electrofluorescence, which frequently results in an increase in the energy efficiency. The use of such metal complexes in low molecular weight OLEDs is described, for example, in M. A. Baldo, S. Lamansky, P. E. Burrows, M. E. Thompson, S. R. Forrest, *Appl. Phys. Lett.* 1999, 75, 4-6.

One class of compounds suitable for this purpose comprises compounds which comprise heavy atoms, i.e. atoms from the Periodic Table of the Elements which have an atomic number of more than 36.

Compounds comprising d and f transition metals which meet the abovementioned condition are particularly useful for this purpose. Very particular preference is given to structural units of this type which comprise elements of groups 8 to 10 (i.e. Ru, Os, Rh, Ir, Pd, Pt).

Possible structural units for the polymers of the invention are various complexes which are described, for example, in the patent applications WO 02/068435, WO 02/081488, EP 1239526 and WO 04/026886.

Corresponding monomers are described in the patent application WO 02/068435. Preferred units of group 4 are units having the formulae (XXXXIX) to (LVI),

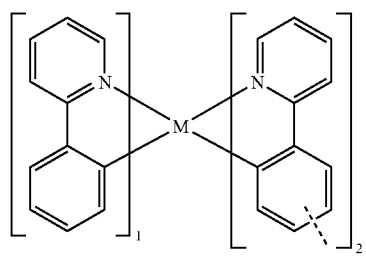
formula (XXXXIX)

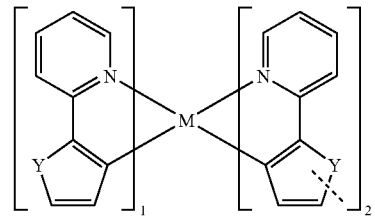
formula (L)

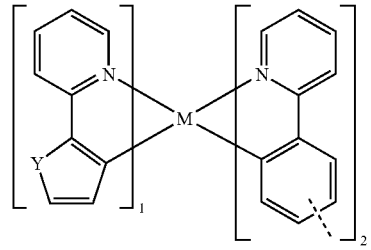
formula (LI)

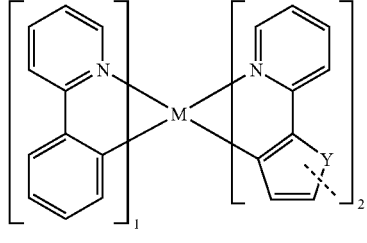
formula (LII)

-continued

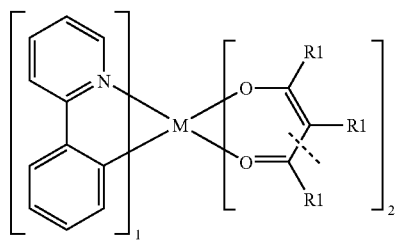

formula (LIII)

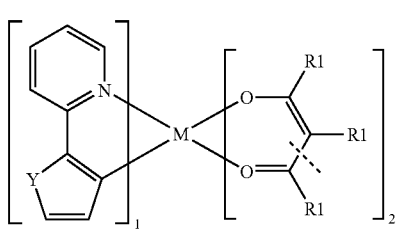

formula (LIV)

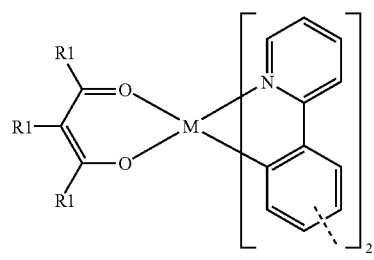

formula (LV)

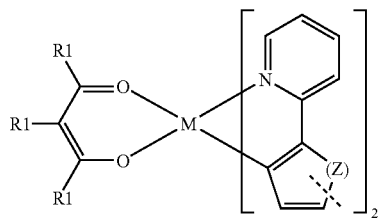

formula (LVI)

where the structures may be substituted in the free positions by substituents R1 and M is Rh or Ir.

Structural elements of group 5 are ones which aid the transition from the singlet state to the triplet state and can be used in a supporting capacity together with the structural elements of group 4 and thus improve the phosphorescence properties of the structural elements of group 4. Possible structural elements of this type are, in particular, carbazole units, particularly preferably bridged carbazole dimer units, as are described in the unpublished patent applications DE 10304819.7 and DE 10328627.6.

Structural elements of group 6 which influence the morphology or the emission color of the polymers include those of the formula (I) and formulae (II) to (LVI) and also ones which comprise at least one further aromatic or other conjugated structure which does not come under the abovementioned groups, i.e. which has little or no influence on the charge carrier mobilities or is not an organic metal complex or has little or no influence on the transition from the singlet state to the triplet state.

Preference is here given to aromatic structures which have from 6 to 40 carbon atoms or stilbene, bisstyrylarylene or tolane derivatives, which may each be substituted by one or more nonaromatic radicals R1.

Particular preference is here given to incorporation of 1,4-phenylene, 1,4-naphthylene, 1,4- or 9,10-anthracenylene, 1,6- or 2,7- or 4,9-pyrenylene, 3,9- or 3,10-perylenylene, 2,7- or 3,6-phenanthrenylene, 4,4'-biphenylylene, 4,4''-terphenylylene, 4,4'-bi-1,1'-naphthylylene, 4,4'-stilbene, 4,4''-bis-styrylarylene or 4,4'-tolane derivatives.

Very particular preference is given to substituted or unsubstituted structures of the formulae (LVII)-(LXVIII).

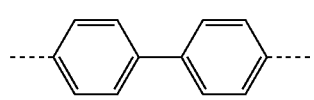

formula (LVII)

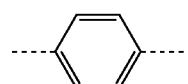

formula (LVIII)

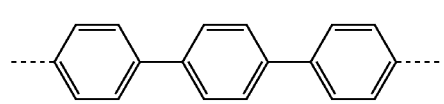

formula (LIX)

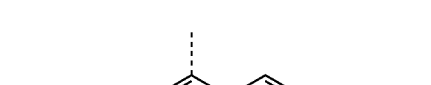

formula (LX)

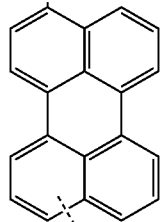

formula (LXI)

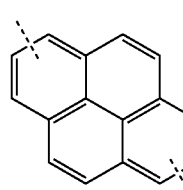

formula (LXII)

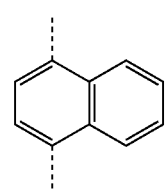

formula (LXIII)

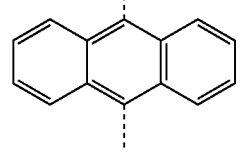

formula (LXIV)

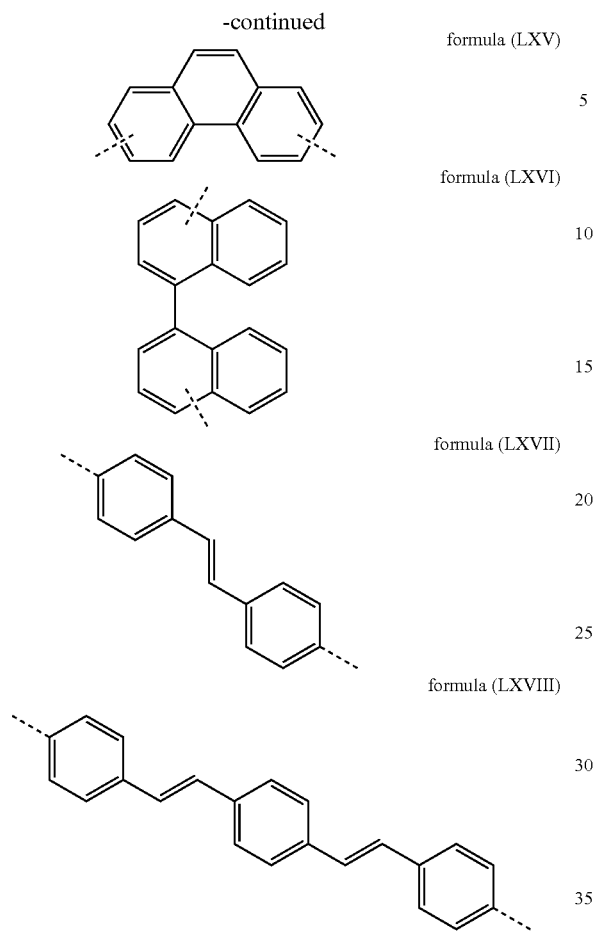

formula (LXV)

formula (LXVI)

formula (LXVII)

formula (LXVIII)

Structural elements of group 7 are units which comprise aromatic structures having from 6 to 40 carbon atoms and are-typically used as polymer backbone. These can, for example, be 4,5-dihydropyrene derivatives, 4,5,9,10-tetrahydropyrene derivatives, fluorene derivatives, spirobifluorene derivatives, 5,7-dihydrodibenzooxepin derivatives and cis- and trans-indenofluorene derivatives.

Preferred units of group 7 are units having the formulae (LXIX) to (LXXVIII), with the various positions being able to be substituted by substituents R1,
YY is Si or Ge and
W is O, S, Se.

formula (LXIX)

formula (LXX)

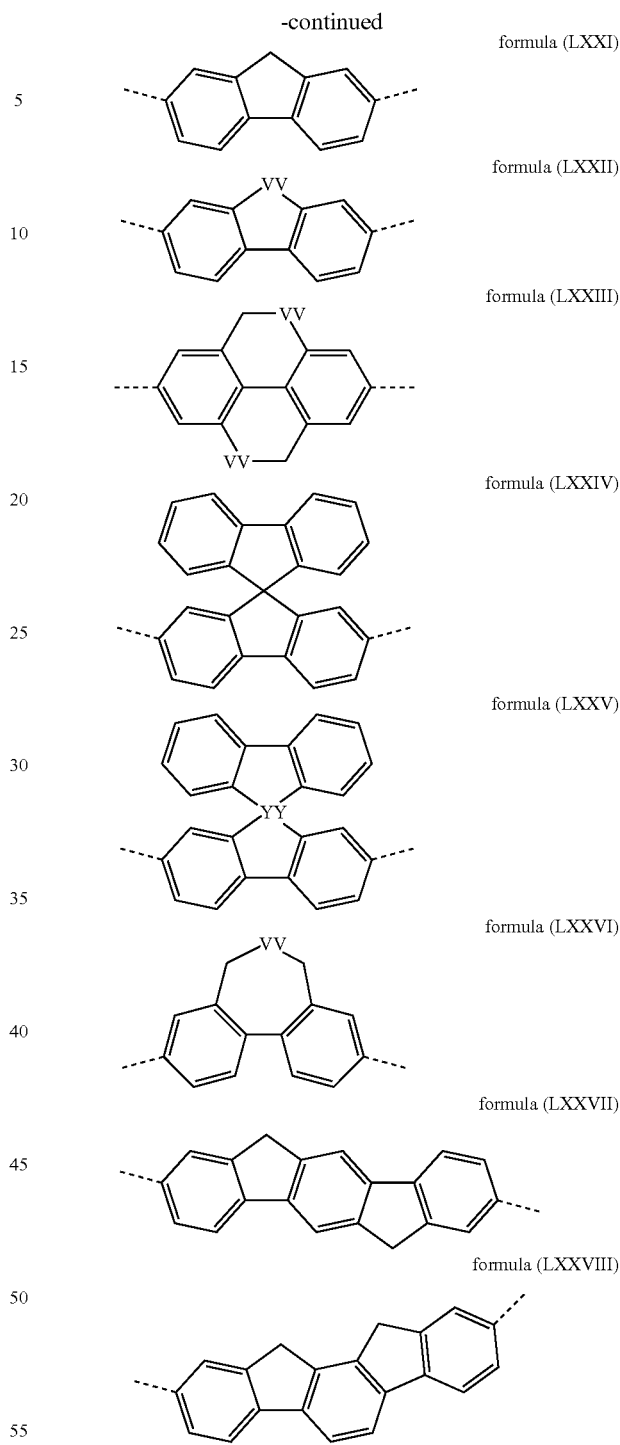

formula (LXXI)

formula (LXXII)

formula (LXXIII)

formula (LXXIV)

formula (LXXV)

formula (LXXVI)

formula (LXXVII)

formula (LXXVIII)

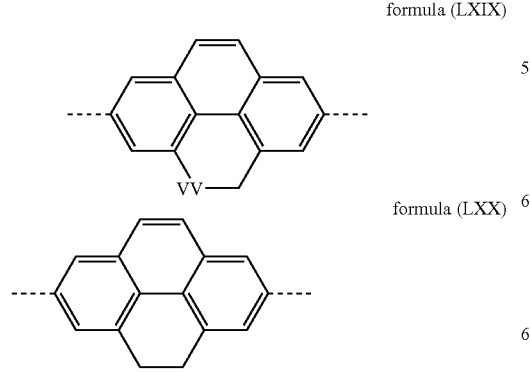

Preference is here given to polymers according to the invention which comprise not only structural units of the formula (I) but at the same time also one or more units selected from among the groups 1 to 7.

It can likewise be preferred for more than one structural unit from one group to be present at the same time. Thus, it can be preferred for at least two structural units from group 1, or group 2, or group 3, or group 4, or group 5, or group 6, or group 7 to be present at the same time.

The polymers of the invention generally have from 10 to 10 000, preferably from 50 to 5000, particularly preferably from 50 to 2000, repeating units.

The necessary solubility of the polymers is ensured, in particular, by the substituents R1 to R4, both on units of the formula (I) and on the other repeating units. If substituents R5 and R6 are present, these also contribute to the solubility. To ensure sufficient solubility, preference is given to an average of at least 2 nonaromatic carbon atoms being present in the substituents per repeating unit. Preference is here given to at least 4, particularly preferably at least 8, carbon atoms. Some of these carbon atoms can also be replaced by O or S. However, it is also quite possible for a proportion of the repeating units, both of the formulae (I) to (LXXVIII) and of other structural types, to bear no further nonaromatic substituents. To avoid adversely affecting the morphology of the film, preference is given to no long-chain substituents having more than 12 carbon atoms in a linear chain being present, preferably no substituents having more than 8 carbon atoms, particularly preferably no substituents having more than 6 carbon atoms.

Nonaromatic carbon atoms are, as, for example, stated in the description of R1 to R4 in the formula (I), present in appropriate straight-chain, branched or cyclic alkyl or alkoxy chains.

The proportion of units of the formula (I) in the polymer is preferably at least 10 mol %, particularly preferably at least 40 mol %. This applies, in particular, when these units are used as polymer backbone. If these units are used as emitting units, their proportion is preferably in the order of from 5 to 20 mol %. Units of the formula (I) which are suitable as emitting units are, in particular, those in which at least one symbol a is 1 and the corresponding symbol b is 1 or 2.

Furthermore, preference is given to polymers according to the invention in which the following applies in units of the formula (I):

X is identical or different on each occurrence and is in each case C(R3)(R4);

R1-R4 are identical or different on each occurrence and are each a straight-chain, branched or cyclic alkyl or alkoxy chain having from 1 to 10 carbon atoms in which one or more H atoms may also be replaced by fluorine, an aryl, heteroaryl or aryloxy group having from 5 to 14 carbon atoms in which one or more carbon atoms may also be replaced by N, S or O and which are also substituted by one or more nonaromatic radicals R5;

the further symbols are as defined above under formula (I).

Furthermore, particular preference is given to polymers according to the invention in which the following applies in units of the formula (I):

X is identical or different on each occurrence and is in each case C(R3)(R4);

Z is identical or different on each occurrence and is in each case C(R5);

R1-R4 are identical or different on each occurrence and are each a straight-chain or branched alkyl or alkoxy chain having from 1 to 8 carbon atoms or an aryl or aryloxy group having from 5 to 14 carbon atoms, in which one or more carbon atoms may also be replaced by N, S or O and which are also substituted by one or more nonaromatic radicals R5;

b is identical or different on each occurrence and is in each case 0 or 1;

the further symbols are as defined above under formula (I).

Very particular preference is, furthermore, given to polymers according to the invention in which the following applies in units of the formula (I):

X is identical or different on each occurrence and is in each case C(R3)(R4);

Z is identical or different on each occurrence and is in each case CH;

R1, R3 are identical or different on each occurrence and are each a straight-chain or branched alkyl chain having from 1 to 8 carbon atoms or an aryl group having from 5 to 10 carbon atoms, in which one or more carbon atoms may also be replaced by N, S or O and which may also be substituted by one or more nonaromatic radicals R5;

R2, R4 are identical or different on each occurrence and are each a straight-chain or branched alkoxy chain having from 1 to 8 carbon atoms;

a is 1 on each occurrence if the units of the formula (I) are used as emitters;

b is 1 on each occurrence if the units-of the formula (I) are used as emitters and is otherwise 0 on each occurrence;

the further symbols are as defined above under formula (I).

Examples of particularly preferred structures of the formula (I) are structures of the formulae (LXXIX) to (CVI), where linkage in the polymer is in each case via the 2,7 positions of the dihydrophenanthrene units, as indicated by the bonds shown as broken lines, and R is a straight-chain or branched alkyl chain having from 1 to 8 carbon atoms:

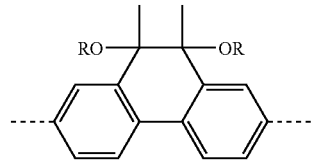

formula (LXXIX)

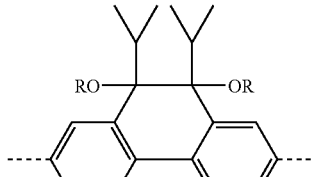

formula (LXXX)

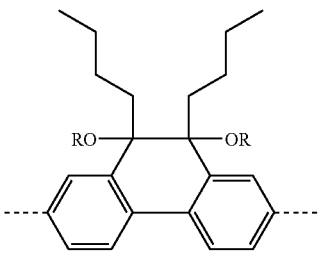

formula (LXXXI)

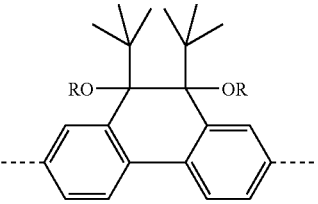

formula (LXXXII)

-continued
formula (LXXXIII)
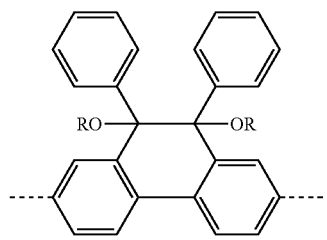
formula (LXXXIV)
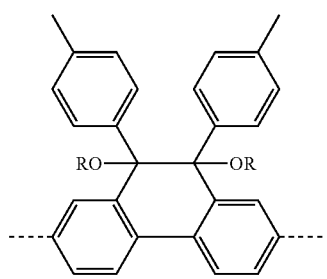
formula (LXXXV)
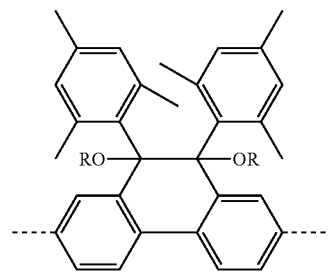
formula (LXXXVI)
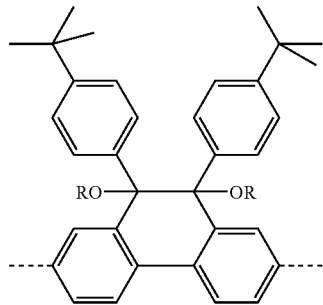
formula (LXXXVI)
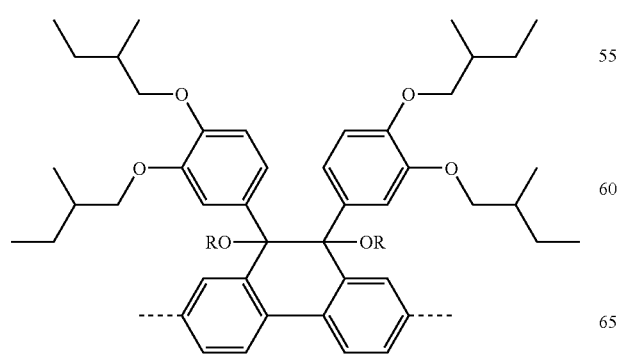
-continued
formula (LXXXVIII)
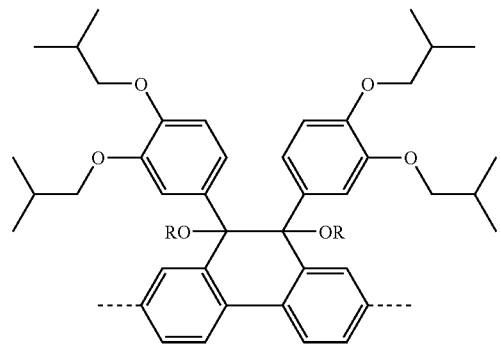
formula (LXXXIX)
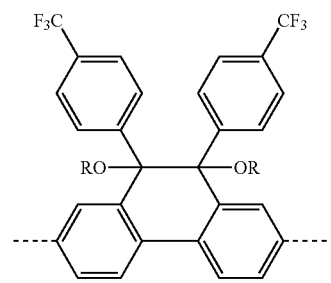
formula (LXXXX)
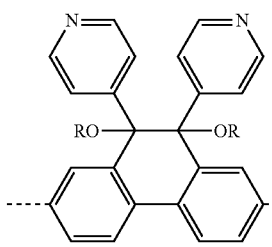
formula (LXXXXI)
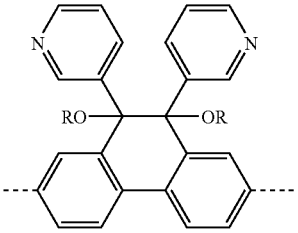
formula (LXXXXII)
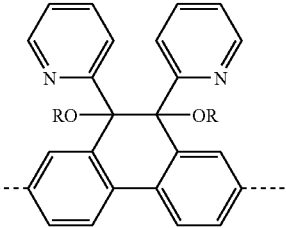
formula (LXXXXIII)
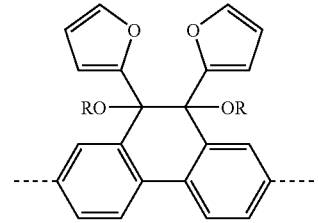

-continued
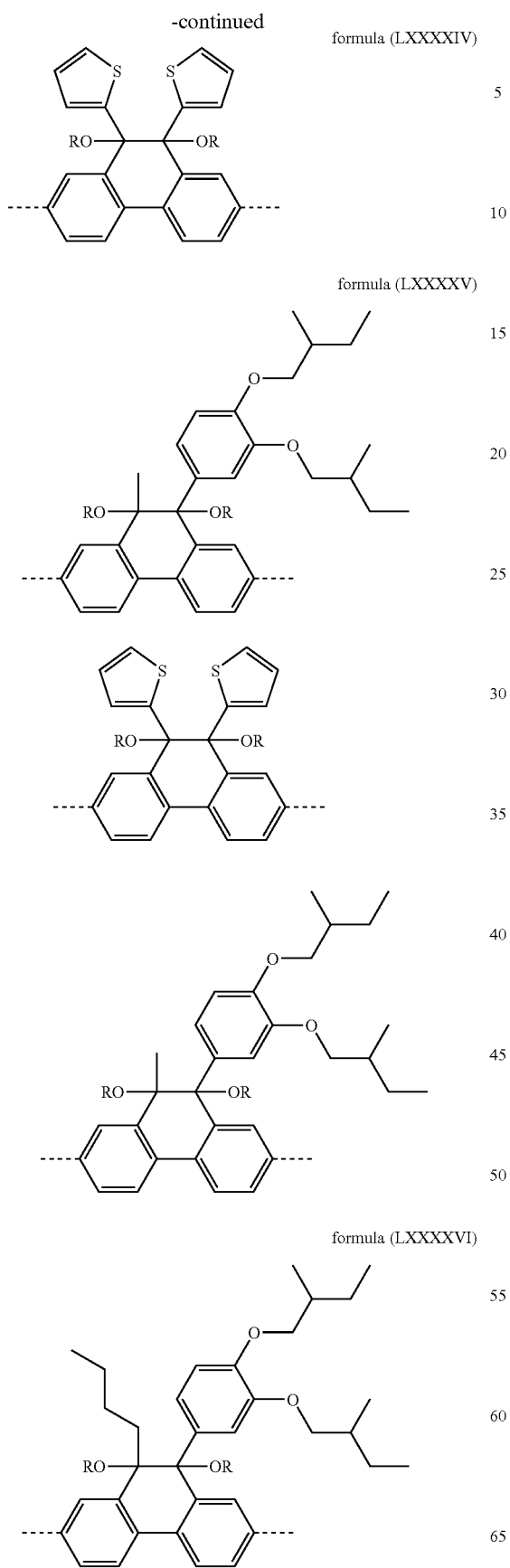
formula (LXXXXIV)
formula (LXXXXV)
formula (LXXXXVI)
-continued
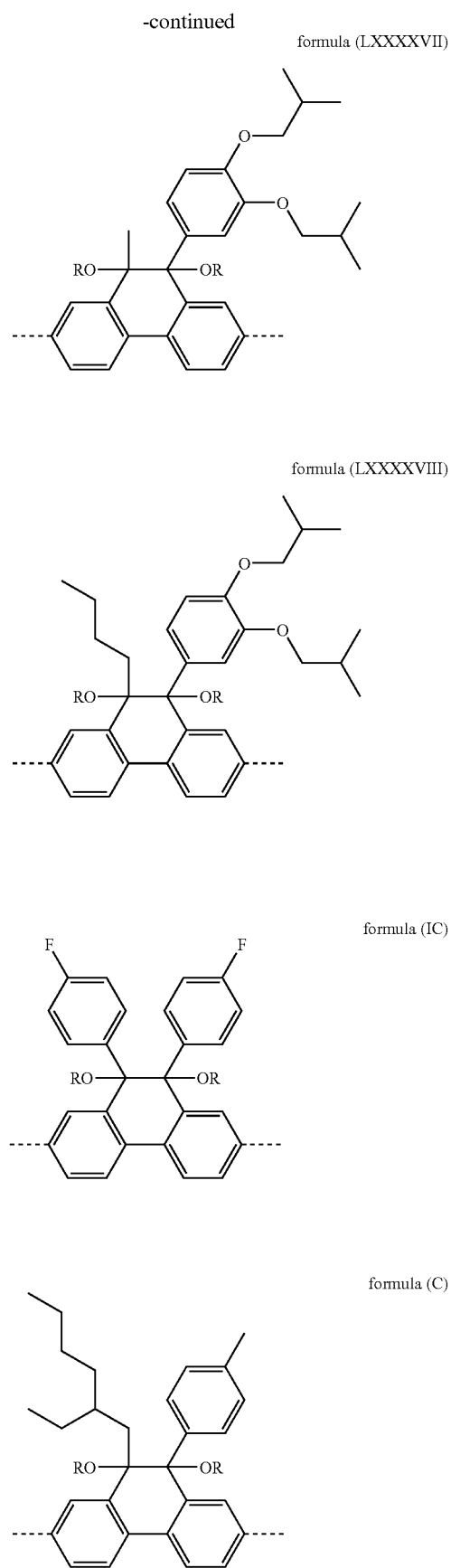
formula (LXXXXVII)
formula (LXXXXVIII)
formula (IC)
formula (C)

-continued

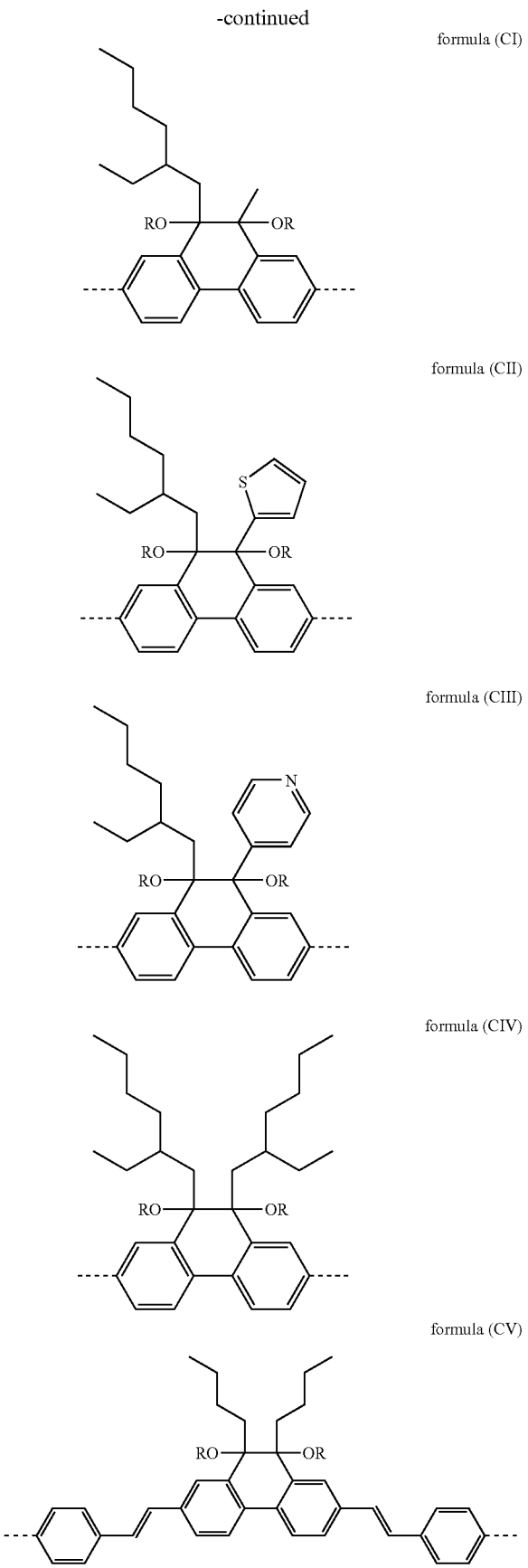

formula (CI)

formula (CII)

formula (CIII)

formula (CIV)

formula (CV)

-continued

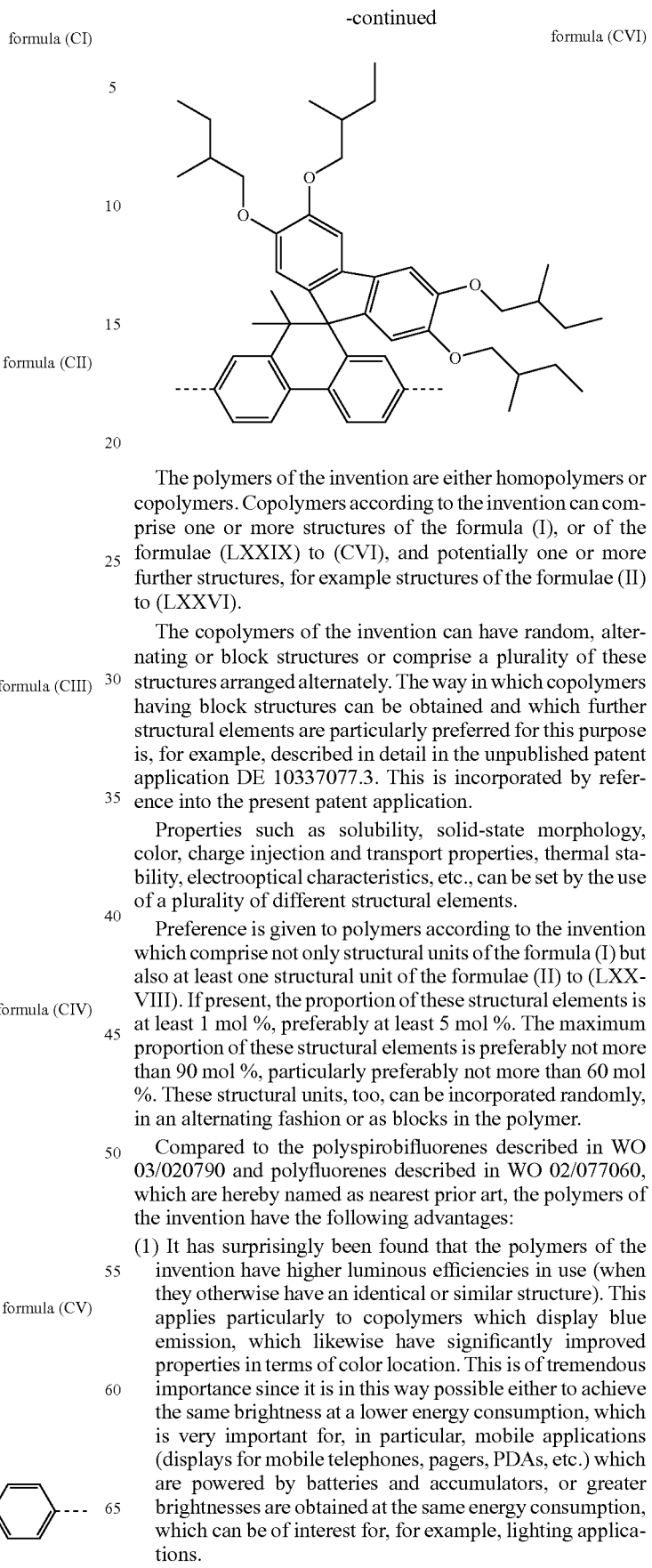

formula (CVI)

The polymers of the invention are either homopolymers or copolymers. Copolymers according to the invention can comprise one or more structures of the formula (I), or of the formulae (LXXIX) to (CVI), and potentially one or more further structures, for example structures of the formulae (II) to (LXXVI).

The copolymers of the invention can have random, alternating or block structures or comprise a plurality of these structures arranged alternately. The way in which copolymers having block structures can be obtained and which further structural elements are particularly preferred for this purpose is, for example, described in detail in the unpublished patent application DE 10337077.3. This is incorporated by reference into the present patent application.

Properties such as solubility, solid-state morphology, color, charge injection and transport properties, thermal stability, electrooptical characteristics, etc., can be set by the use of a plurality of different structural elements.

Preference is given to polymers according to the invention which comprise not only structural units of the formula (I) but also at least one structural unit of the formulae (II) to (LXXVIII). If present, the proportion of these structural elements is at least 1 mol %, preferably at least 5 mol %. The maximum proportion of these structural elements is preferably not more than 90 mol %, particularly preferably not more than 60 mol %. These structural units, too, can be incorporated randomly, in an alternating fashion or as blocks in the polymer.

Compared to the polyspirobifluorenes described in WO 03/020790 and polyfluorenes described in WO 02/077060, which are hereby named as nearest prior art, the polymers of the invention have the following advantages:

(1) It has surprisingly been found that the polymers of the invention have higher luminous efficiencies in use (when they otherwise have an identical or similar structure). This applies particularly to copolymers which display blue emission, which likewise have significantly improved properties in terms of color location. This is of tremendous importance since it is in this way possible either to achieve the same brightness at a lower energy consumption, which is very important for, in particular, mobile applications (displays for mobile telephones, pagers, PDAs, etc.) which are powered by batteries and accumulators, or greater brightnesses are obtained at the same energy consumption, which can be of interest for, for example, lighting applications.

(2) Furthermore, it has surprisingly been found that, once again in direct comparison, the polymers of the invention have longer operating lives, in particular in the case of green- and blue-emitting PLEDs.
(3) From the point of view of solubility behavior (e.g. gelling temperature at a given concentration, viscosity at a given concentration), too, the polymers of the invention are the equal of the known polymers or sometimes have a better solubility in a wide range of solvents.
(4) The availability and the achievability of colors in the case of the polymers of the invention are equal to those of the prior art. Although this is not a direct advantage, it means that the monomers used according to the invention can be employed without changing further process parameters in the polymerization, which was not to be expected and is thus surprising.

The way in which the structures of the formulae (II) to (LXXVIII) are incorporated has been indicated directly for a number of them (cf., for example, formulae (II) to (VI) and formulae (XIV) to (XX)). In the case of other structures, a number of possibilities are encompassed by the invention. However, in the case of these too, there are preferred modes of incorporation, namely the modes of incorporation described in WO 03/020790. With regard to the synthesis of the above-described monomers (II) to (LXVIII), reference will at this point merely be made to the comprehensive description in WO 03/020790; this and the references cited therein are incorporated by reference into the present invention.

Monomers of the formulae (XXXIII) to (XXXXVIII) can be synthesized in accordance with the information given for the formulae (II) to (XXXII) by combining the appropriate precursors, as described in WO 03/020790.

The preparation of monomers from group 4, which give rise to electrophosphorescence instead of electrofluorescence, is described in the abovementioned patent application WO 02/068435; this is incorporated by reference into the present invention.

With regard to the preparation of monomers from group 5, which aid the transition from the singlet state to the triplet state, reference may at this point be made to the above-cited patent applications DE 10304819.7 and DE 10328627.6; these are incorporated by reference into the present patent application.

The preparation of monomers of the formulae (LVII) to (LXVIII), which influence the morphology or the emission color of the polymers, is described in the patent application WO 03/020790. In contrast to what is said there, these are introduced into the present polymers of the invention only as additional possibilities to allow further modifications.

Monomers of the formulae (LXIX) to (LXXVI), which can function as backbone of the resulting polymer, can be prepared as described in the following references: structural units of the formula (LXIX) can be prepared, for example, as described by Oae et al., *Bull. Chem. Soc. Jpn.* 1981, 54, 2374-78. Monomers for incorporation of structural units of the formula (LXX) can be prepared, for example, as described by Blaschke et al., *J. Am. Chem. Soc.* 1970, 92, 3675-81. The patent application WO 00/46321 describes the synthesis of monomers of the type (LXXI), among other comonomers. The preparation of monomers of the formula (LXXII) in which VV=O is described in Costero et al., *J. Chem. Res. Miniprint* 1994, 4, 761-769. The synthesis of monomers of the formula (LXXIII) in which VV=O is reported, for example, in Wang et al., *Eur. J. Med. Chem. Chim. Ther.* 1999, 34, 215-224. Methods of preparing monomers of the structure shown in formula (LXXIV) are described, for example, in the patent application WO 03/020790. Compounds of the type (LXXV) in which YY=Si are described by Ballweg et al., *Silicon Chemistry* 2002, 1, 57-60, and the synthesis of monomers of the formula (LXXVI) is described by Williams et al., *J. Chem. Soc., Chem. Commun.* 1996, 2259-2260 for VV=O. Compounds of the type (LXXVII) can, for example, be synthesized as described in WO 04/041901, and compounds of the type (LXXVIII) can be synthesized as described in the unpublished patent application EP 03014042.0.

Monomers which lead to structural units of the formula (I) in the polymers of the invention are dihydrophenanthrenes or corresponding nitrogen-containing derivatives which are appropriately substituted in the 9,10 positions and on the 2,7 positions bear suitable functions which allow these monomer units to be incorporated into the polymer.

The literature on the synthesis of such dihydrophenanthrene compounds refers to a number of methods, e.g. the $Ni(COD)_2$-catalyzed cascade reaction between o-bromoacetophenones (Scherf et al., *J. Org. Chem.* 1999, 64, 655-58), which leads to pinacols. Such pinacols can likewise be obtained by double reaction of a Grignard reagent, an organolithium compound or an organozinc compound with phenanthrenequinone. It can be preferable to carry out the reaction with the organometallic Mg, Li or Zn reagent firstly on the phenanthrenequinone and only introduce functions which allow polymerization, for example bromo functions, at the end. It can likewise be preferable firstly to functionalize the phenanthrenequinone, for example by bromination, and then carry out the reaction with the organometallic Mg, Li or Zn reagent.

The pinacols formed by reaction with the organometallic Mg, Li or Zn reagent can be etherified in order to introduce further solubilizing substituents. Furthermore, an ester function as described in the literature (F. Uckert, thesis, University of Mainz 1998) would also be a possibility here. However, this approach involving generation of carbonyl functions in the polymer would be ruled out in the present invention because of the unknown subsequent reaction path of the expected $n \rightarrow \pi^*$ transition (e.g. Norrish type 1 cleavage).

Unsymmetrical dihydrophenanthrene derivatives can be obtained, for example, by reaction of a phenanthrenequinone with one equivalent of an organometallic Mg, Li or Zn reagent as described above, subsequent etherification of the alcohol formed and reaction with a further equivalent of another organometallic Mg, Li or Zn reagent, once again followed by etherification.

The route of the double reaction with an organometallic Mg, Li or Zn reagent and subsequent alkylation makes it possible not only to introduce solubilizing substituents but also to introduce further functions in the correct position within the biaryl axis (directing effect). Thus, for example, a dibromo derivative can be produced by bromination, for example by means of elemental bromine or NBS, and this can either be used directly as monomer in the polymerization or be converted by methods known to those skilled in the art into, for example, boronic acid derivatives or stannates which can then likewise be used in the polymerization.

Other synthetic routes, e.g. photochemical variants (irradiation of vinyl-substituted biphenyls), lead to dihydrophenanthrenes (Laarhoven et al., *J. Chem. Soc. Perkin Trans.* 2, 1978, 915-22) which bear benzylic hydrogen atoms which, in diode operation, have been found to lead to shortened lives and are therefore not preferred.

Monomers which lead to units of the formula (I) in the polymer are novel and are therefore likewise subject matter of the present invention.

The invention therefore further provides bifunctional monomeric compounds of the formula (CVII),

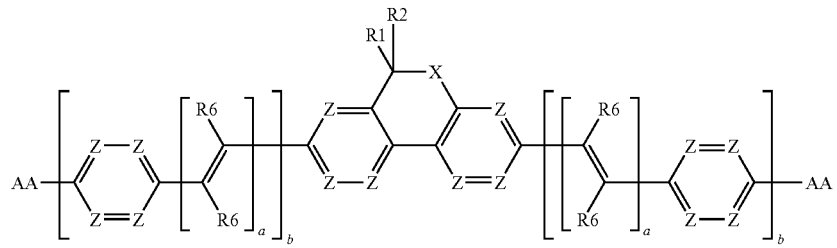

FORMULA (CVII)

characterized in that the two functional groups AA, which may be identical or different, copolymerize under conditions of C—C coupling; the further symbols have the same meanings as in the formula (I) with the proviso that not all radicals R1 to R4 can at the same time be fluorine or chlorine.

AA is preferably selected from among the groups Cl, Br, I, O-tosylate, O-triflate, O—SO$_2$R5, B(OH)$_2$, B(OR5)$_2$ and Sn(R5)$_3$.

The C—C coupling reactions are preferably selected from among SUZUKI coupling, YAMAMOTO coupling and STILLE coupling.

Particular preference is here given to monomeric compounds of the formula (CVII) which after reaction lead to structural units of the formulae (LXXIX) to (CVI) in the polymer.

The invention further provides a process as shown in formula (CVIII) for preparing symmetrical, monomeric bifunctional compounds of the formula, (CVII) or a process as shown in formula (CIX) for preparing unsymmetrical, monomeric bifunctional compounds of the formula (CVII) in which X is C(R3)(R4) and Z is C(R5) and, in addition, R1 and R3 are each an alkyl or aryl group and R2 and R4 are each an alkoxy group, characterized in that a phenanthrenequinone is reacted with an organomagnesium or organolithium or organozinc compound, followed by reaction with an alkylating reagent R-LG under basic conditions:

where the symbols used have the following meanings:
BB is identical or different on each occurrence and is in each case H or has the same meaning as described above for M;
R-LG is identical or different on each occurrence and is in each case an alkylating reagent, where R is an alkyl group, preferably a linear or branched alkyl chain having from 1 to 8 carbon atoms, and LG is a group which reacts as a leaving group under the conditions of nucleophilic aliphatic substitution, preferably Cl, Br, I, O-tosylate or O-triflate;
R1, R3 are each an alkyl, aryl or heteroaryl group;
R2, R4 are each an alkoxy group O—R, where R is as defined above;
Hal is F, Cl, Br, I.

To synthesize the unsymmetrical monomeric compounds, the sequence comprising addition of the organometallic Mg, Li or Zn reagent followed by reaction with an alkylating reagent is carried out twice in succession.

For the purposes of the present invention, organomagnesium compounds are compounds which have at least one Mg—C bond, with preference being given not only to R$_2$Mg but also to R—Mg halide (R=alkyl, aryl) as Grignard compounds. Organolithium compounds are compounds which have at least one Li—C bond, in the simplest case R—Li, e.g. phenyllithium, butyllithium, methyllithium, with covalent multicenter bonds being expressly permitted. Organozinc compounds are compounds which have at least one Zn—C bond, with preference being given to compounds of the general formulae R$_2$Zn and R—Zn halide (R=alkyl, aryl).

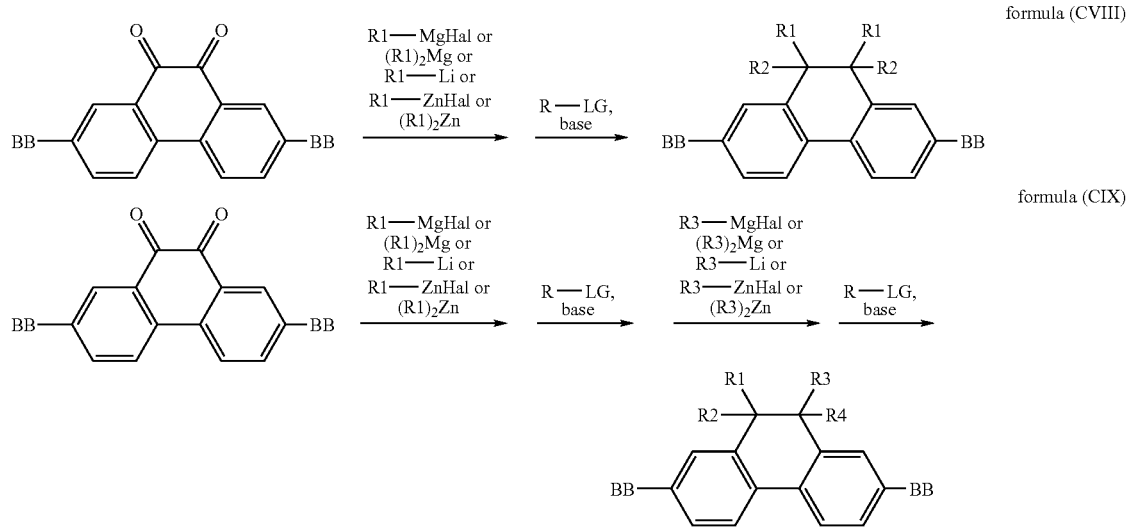

formula (CVIII)

formula (CIX)

Suitable bases for the etherification are preferably metal hydrides, e.g. sodium hydride, metal carbonates, e.g. sodium carbonate or potassium carbonate, or metal alkoxides, e.g. sodium methoxide, sodium ethoxide or potassium tert-butoxide.

In a preferred embodiment of the process as shown in the formula (CVIII) or (CIX), a Grignard compound is used as organometallic reagent.

The polymers of the invention are generally prepared by polymerization of one or more types of monomer of which at least one monomer is described by the formula (I) and, if present, further monomers are described by the formulae (II) to (LXXVIII). There are in principle many appropriate polymerization-reactions. However, a few types which all lead to C—C coupling have been found to be particularly useful for this purpose:
(A) SUZUKI polymerization
(B) YAMAMOTO polymerization
(C) STILLE polymerization.

The way in which the polymerization can be carried out according to these methods and the way in which the polymers can then be separated off from the reaction medium and purified are described in detail in, for example, WO 03/048225 and WO 04/022626.

In addition, it can be preferable to use the polymer of the invention not as a pure substance but instead as a mixture (blend) together with any further desired polymeric, oligomeric, dendritic or low molecular weight substances. These can, for example, improve the electronic properties, influence the transfer from the singlet state to the triplet state or themselves be emitters. However, electronically inactive substances can also be appropriate, for example to influence the morphology of the polymer film formed or to influence the viscosity of polymer solutions. Such blends are therefore also provided by the present invention.

The invention further provides solutions and formulations comprising one or more polymers or blends according to the invention in one or more solvents. The way in which polymer solutions can be prepared is described, for example, in WO 02/072714, WO 03/019694 and the references cited therein. These solutions can be used to produce thin polymer layers, for example by area coating processes (e.g. spin coating) or by printing processes (e.g. ink jet printing).

The polymers of the invention can be used in PLEDs. The way in which PLEDs can be produced is described comprehensively as a general process in WO 04/037887, and this can be adapted appropriately for the individual case.

As described above, the polymers of the invention are very particularly useful as electroluminescence materials in the PLEDs or displays produced in this way.

For the purposes of the invention, electroluminescence materials are materials which can be used as active layer in a PLED. "Active layer" means that the layer is capable of radiating light on application of an electric field (light-emitting layer) and/or that it improves the injection and/or transport of the positive and/or negative charges (charge injection or charge transport layer).

The invention therefore also provides for the use of a polymer according to the invention in a PLED, in particular as electroluminescence material.

The invention thus likewise provides a PLED having one or more active layers of which at least one comprises one or more polymers according to the invention. The active layer can be, for example, a light-emitting layer and/or a charge transport layer and/or a charge injection layer.

The present patent application text and also the further examples below are directed at the use of polymers or blends according to the invention for PLEDs and the corresponding displays. Despite this restriction of the description, a person skilled in the art will be able, without making a further inventive step, to utilize the polymers of the invention for further applications in other electronic devices, e.g. for organic integrated circuits (O-ICs), in organic field effect transistors (OFETs), in organic thin film transistors (OTFTs), for organic solar cells (O-SCs), for organic photoreceptors or for organic laser diodes (O lasers), to name only a few applications. The use of polymers according to the invention in the corresponding devices and also these devices themselves are likewise subject matter of the present invention.

EXAMPLES

Part A: Synthesis of the Monomers According to the Invention for Units of the Formula (I) (dihydrophenanthrene(=DHP) Units)

A 1 Synthesis of Symmetrical DHP Monomers

A 1.1 Synthesis of 2,7-substituted 9,10-dibutyl-9,10-dimethoxy-9,10-dihydrophenanthrenes A 1.1.1 Synthesis of 9,10-dibutyl-9,10-dihydrophenanthrene-9,10-diol 300 ml of a 2.0 M solution of n-butylmagnesium chloride (0.6 mol) were added dropwise to a solution of 41.75 g (0.2 mol) of phenanthrenequinone in 800 ml of dry THF at an internal temperature of 10° C. over a period of 1.5 hours and the mixture was subsequently stirred at RT for 6 hours. After hydrolysis with 125 ml of saturated $NH_4Cl$ solution, the precipitate was filtered off with suction, washed with ethyl acetate, the filtrate was extracted twice with Water and the organic phase was dried over $Na_2SO_4$. The brown solid which remained after evaporation of the solvent was subsequently recrystallized twice from $EtOH/H_2O$ (70:30). This gave 60.6 g (93%) of colorless needles.

$^1$H-NMR ($CDCl_3$): [ppm]=7.68 (dd, $^3J_{HH}$=6.7 Hz, $^4J_{HH}$=1.7 Hz, 2 H), 7.55 (dd, $^3J_{HH}$=6.4 Hz, $^4J_{HH}$=1.7 Hz, 2 H), 7.33 (m, 4 H), 2.04 (s, exchangeable with $D_2O$, 2 H, OH), 1.75 (m, 2 H, alkyl), 1.44 (m, 2 H, alkyl), 1.32 (m, 2 H, alkyl), 1.1 (m, 2 H, alkyl), 1.00 (m, 2 H, alkyl), 0.77 (m, 2 H, alkyl), 0.73 (t, $^3J_{HH}$=7.4 Hz, 6 H, alkyl).

A 1.1.2 Synthesis of 9,10-dibutyl-9,10-dimethoxy-9,10-dihydrophenanthrene 26.6 g of the diol prepared above in 80 ml of dry DMSO were added dropwise to a suspension of 10 g of NaH (60% in mineral oil, 250 mmol) in 80 ml of dry DMSO at an internal temperature of about 15° C. over a period of 30 minutes, the mixture was stirred at RT for a further 30 minutes and 16 ml of MeI (250 mmol) were subsequently added by means of a syringe over a period of 1 hour and the solution was stirred for a further 2 hours. 80 ml of 15% $NH_4OH$ were subsequently added dropwise, the reaction mixture was extracted twice with ethyl acetate and the combined organic phases were washed three times with water and dried over $Na_2SO_4$. Removal of the solvent under reduced pressure gave a beige oil which, according to RP-HPLC, had a purity of 99.0% and was used without further purification in the subsequent reaction.

$^1$H-NMR ($CDCl_3$): [ppm]=7.64 (dd, $^3J_{HH}$=7.4 Hz, $^4J_{HH}$=2.3 Hz, 2 H), 7.51 (dd, $^3J_{HH}$=6.7 Hz, $^4J_{HH}$=2.3 Hz, 2 H), 7.28 (m, 4 H), 3.70 (s, 6 H, OMe), 2.13 (m, 2 H, alkyl), 1.52

(m, 2 H, alkyl), 1.16 (m, 2 H, alkyl), 1.08 (m, 2 H, alkyl), 0.97 (m, 2 H, alkyl), 0.88 (m, 2 H, alkyl) 0.67 (t, $^3J_{HH}$=7.4 Hz, 6 H, alkyl).

A 1.1.3. Synthesis of 2,7-dibromo-9,10-dibutyl-9,10-dimethoxy-9,10-dihydro-phenanthrene (EM1)

28.9 g (82 mmol) of 9,10-dibutyl-9,10-dimethoxy-9,10-dihydrophenanthrene were dissolved in 190 ml of dry DMF, 17 ml of bromine (0.33 mol) were added dropwise over a period of 1 hour by cooling in ice and the mixture was subsequently stirred at RT for 48 hours. After this time, 125 ml of saturated $Na_2SO_3$ solution were added and the mixture was extracted twice with $CH_2Cl_2$, the combined organic phases were reextracted three times with saturated $NaHCO_3$ solution and dried over $Na_2SO_4$. The yellow solid which remained after removal of the solvent was, recrystallized three times from MeOH/i-PrOH. This left 17.6 g (42%) of colorless crystals which, according to RP-HPLC, had a purity of >99.98%.

$^1$H-NMR ($CDCl_3$): [ppm]=7.65, (d, $^4J_{HH}$=1.7 Hz, 2 H), 7.43 (m, 4 H), 3.67 (s, 6 H, OMe), 2.11 (m, 2 H, alkyl), 1.44 (m, 2 H, alkyl), 1.10 (m, 6 H, alkyl), 0.67 (t, $^3J_{HH}$=7.4 Hz, 6 H, alkyl), 0.59 (m, 2 H, alkyl). The 2,7 positions of the bromine atoms were confirmed by NOE spectroscopy.

A 1.1.4. Synthesis of 9,10-dibutyl-9,10-dimethoxy-9,10-dihydrophenanthrene-2,7-bis(boronic acid ethylene glycol ester) (EM2)

A Grignard solution prepared from 4.9 g of Mg (203 mmol), 100 mg of iodine (0.4 mmol), 0.75 ml of dichloroethane (9.5 mmol) and 49.3 g of 2,7-dibromo-9,10-dibutyl-9,10-dimethoxy-9,10-dihydrophenanthrene (96.6 mmol) in 270 ml of THF was added dropwise to a solution of 30.1 g of $B(OMe)_3$ (590 mmol) in 125 ml of THF at −75° C. over a period of 2 hours. The mixture was allowed to warm to 0° C. over a period of 6 hours, after which the viscosity of the suspension had increased substantially. The suspension was diluted with 100 ml of ethyl acetate, admixed with 15 ml of glacial acetic acid and 35 ml of $H_2O$, the organic phase was separated off, washed twice with 1 M HCl and dried over $Na_2SO_4$. The syrup which remained after removal of the solvent under reduced pressure was suspended in 175 ml of dry toluene, 10.8 ml of ethylene glycol (193 mmol) were added and the mixture was boiled on a water separator. The now clear solution was evaporated under reduced pressure and the solid residue was recrystallized once from ethyl acetate and three times from toluene/heptane. This left 32 g (66%) of the bisboronic ester as colorless crystals having a purity determined by RP-HPLC of 99.97%.

$^1$H-NMR ($CDCl_3$): [ppm]=7.96 (s, 2 H), 7.75 (d, $^3J_{HH}$=7.7 Hz, 2 H), 7.69 (d, $^3J_{HH}$=7.7 Hz, 2 H), 4.39 (s, 8 H, ethylene), 3.70 (s, 6 H, OMe), 2.12 (m, 2 H, alkyl), 1.48 (m, 2 H, alkyl), 1.17 (m, 2 H, alkyl), 1.03 (m, 2 H, alkyl), 0.94 (m, 2 H, alkyl), 0.65 (t, $^3J_{HH}$=7.4 Hz, 6 H, alkyl), 0.57 (m, 2 H, alkyl).

A 1.2 Synthesis of 2,7-substituted 9,10-(4-tert-butylphenyl)-9,10-dimethoxy-9,10-dihydrophenanthrenes

A 1.2.1 Synthesis of 2,7-dibromophenanthrenequinone 62.5 g of phenanthrenequinone (300 mmol) were dissolved in 750 ml of concentrated $H_2SO_4$ and admixed at room temperature with 106.8 g of NBS (600 mmol). After vigorous stirring for 30 minutes, the dark slurry was poured into 2 l of ice water, the light-red precipitate was filtered off with suction, washed with water and stirred in EtOH (500 ml). Renewed filtration with suction and boiling in $CH_2Cl_2$ gave the dibromide (85 g, 77%) in sufficient purity for further reactions (about 98% according to $^1$H-NMR).

$^1$H-NMR ($d_6$-DMSO): [ppm]=8.21 (d, $^3J_{HH}$=8.7 Hz, 2 H), 8.08 (d, $^4J_{HH}$=2.3 Hz, 2 H), 7.95 (dd, $^3J_{HH}$=8.4 Hz, $^4J_{HH}$=2.0 Hz, 2 H).

A 1.2.2 Synthesis of 2,7-dibromo-9,10-bis-(t-butylphenyl)-9,10-dihydroxy-9,10-dihydrophenanthrene The Grignard reagent prepared from 132.2 g of 4-tert-butylbromobenzene (621 mmol) and 15.1 g of Mg (621 mmol) in 620 ml of dry THF was added dropwise to a suspension of 75.5 g of dibromophenanthrenequinone (207 mmol) in 500 ml of dry THF at an internal temperature of 0° C. over a period of 30 minutes. The resulting green solution was stirred at RT for 1 hour and then admixed with 200 ml of saturated $NH_4Cl$ solution, filtered off from the resulting precipitate with suction, the latter was washed with ethyl acetate and the filtrate was extracted twice with water. The combined organic phases were dried over $Na_2SO_4$, freed of the solvent and the solid which remained was boiled in MeOH. This gave 86.6 g (66%) of the diol as a colorless solid.

$^1$H-NMR ($CDCl_3$): [ppm]=7.73 (d; $^3J_{HH}$=8.4 Hz, 2 H), 7.66 (d, $^4J_{HH}$=2.3 Hz, 2 H), 7.53 (dd, $^3J_{HH}$=8.4 Hz, $^4J_{HH}$=2.0 Hz, 2 H), 7.27 (m, 4 H), 7.22 (m, 4 H), 2.33 (s, exchangeable with $D_2O$, 2 H, O—H), 1.24 (s, 18 H, t-Bu).

A 1.2.3 Synthesis of 2,7-dibromo-9,10-bis-(t-butylphenyl)-9,10-dimethoxy-9,10-dihydrophenanthrene (EM3)

69.3 g of the dihydrophenanthrenediol prepared above were added a little at a time to a suspension of 13.1 g of NaH (60% dispersion in mineral oil, 328 mmol) in 180 ml of dry DMSO at RT and the dark solution was stirred at RT for 30 minutes. 20.4 ml of MeI (328 mmol) were subsequently added dropwise, resulting in formation of a colorless solid. After 3 hours, 180 ml of 15% $NH_4OH$ and 100 ml of MeOH were added dropwise, the crystal slurry was filtered with suction and the solid was washed with water and EtOH. The solid was recrystallized three times from EtOH/toluene to give 47 g (65%) of the bisether having a purity of >99.90% (RP-HPLC).

$^1$H-NMR ($CDCl_3$): [ppm]=7.77 (d, $^3J_{HH}$=8.3 Hz, 2 H), 7.58 (dd, $^3J_{HH}$=8.4 Hz, $^4J_{HH}$=2.0 Hz, 2 H), 7.48 (d, $^4J_{HH}$=2.0 Hz, 2 H), 7.31 (br, d, $^3J_{HH}$=8.0 Hz, 2 H), 7.27(br, d, $^3J_{HH}$=7.9 Hz; 2 H), 6.74 (br, d, $^3J_{HH}$=8.0 Hz, 2 H), 6.25 (br, d, $^3J_{HH}$=8.1 Hz, 2 H), 2.77 (s, 6 H, O-Me), 1.29 (s, 18 H, t-Bu). The 2,7 positions of the bromine atoms were confirmed by means of NOE spectroscopy.

A 1.2.4 Synthesis of 9,10-bis-(t-butylphenyl)-9,10-dimethoxy-9,10-dihydro-phenanthrene-2,7-bis(boronic acid ethylene glycol ester) (EM4)

A Grignard reagent prepared from 23.6 g of the abovementioned DHP dibromide (35.6 mmol) and 1.8 g of Mg in 100 ml of dry THF was added dropwise to a solution comprising 11.1 g of $B(OMe)_3$ in 50 ml of dry THF at −60° C. over a period of 4 hours. After warming to RT, the viscous RG was diluted with 10 ml of glacial acetic acid and 50 ml of water and extracted three times with ethyl acetate. The combined organic phases were washed twice with saturated NaCl solution and dried over Na$_2$SO$_4$. The colorless foam which remained after removal of the solvent under reduced pressure was suspended in 100 ml of toluene, 4 ml of ethylene glycol (71.2 mmol) were added and the mixture was heated to boiling until the amount of water given off was constant. The solvent was subsequently distilled off and the solid which remained was recrystallized four times from ethyl acetate. This gave 17 g (74%) of the bisbororic ester as colorless crystals having a purity of >99.90% (RP-HPLC).

$^1$H-NMR (CDCl$_3$): [ppm]=7.99 (d, $^3J_{HH}$=7.7 Hz, 2 H), 7.92 (dd, $^3J_{HH}$=7.7 Hz, $^4J_{HH}$=1.3 Hz, 2 H), 7.78 (d, $^4J_{HH}$=1.3 Hz, 2 H), 7.36 (br, d, $^3J_{HH}$=8.0 Hz, 2 H), 7.22 (br, d, $^3J_{HH}$=6.8 Hz, 2 H), 6.72 (br, d, $^3J_{HH}$=7.7 Hz, 2H), 6.24 (br, d, $^3J_{HH}$=6.7 Hz, 2 H), 4.33 (m, 8 H, ethylene), 2.73 (s, 6 H, O-Me), 1.29 (s, 18 H, t-Bu).

A 2 Synthesis of Spiro-DHP Monomers

A 2.1 Preparation of spiro[9H-2,3,6,7-tetrakis(2-methylbutyloxy)fluorene-9,9'(10'H)-10',10'-dimethyl-2,7-dibromophenanthrene] (EM5)

The Grignard reagent was prepared from 5.3 g of Mg (216.3 mmol) and 108.3 g (187.4 mmol) of 2-bromo-4,5,3', 4'-tetrakis(2-methylbutoxy)biphenyl in 250 ml of dry THF in a dry apparatus and was subsequently added dropwise to a solution of 2,7-dibromo-10,10-dimethyl-10H-phenanthren-9-one (54.8 g, 144.2 mmol) in 220 ml of THF at RT. The mixture was refluxed for 4 hours. To work up the mixture, it was stirred into 50 ml of HCl in 500 ml of ice water, extracted with ethyl acetate, dried over Na$_2$SO$_4$ and freed of the solvent under-reduced pressure. The residue was suspended in 500 ml of glacial acetic acid and 10 ml of concentrated HCl and refluxed for 4 hours. The precipitate formed was filtered off with suction, washed with glacial acetic acid, water and MeOH and recrystallized four times from i-PrOH. This gave 56 g (45%) of colorless crystals having a purity determined by RP-HPLC of 99.80%.

$^1$H-NMR (CDCl$_3$): [ppm]=7.72 (d, $^3J_{HH}$=8.4 Hz, 1 H), 7.69 (d, $^3J_{HH}$=8.4 Hz, 1 H), 7.50 (dd, $^3J_{HH}$=8.4 Hz, $^4J_{HH}$=2 Hz, 1 H), 7.44 (dd, $^3J_{HH}$=8.4 Hz, $^4J_{HH}$=2 Hz, 1 H), 7.39 (d, $^4J_{HH}$=1.7 Hz, 1 H), 7.16 (br, s, 1 H), 7.00 (br, s, 1 H), 6.94 (br, s, 1 H), 7.00 (br, s, 1 H), 6.90 (d, $^4J_{HH}$=1.7 Hz, 1 H), 5.74 (br, s, 1 H), 3.82 (m, 6 H), 3.12 (m, 2 H), 0.5-2.1 (m, 42 H).

A 3 Synthesis of Unsymmetrical DHP Monomers

A 3.1 Preparation of 2,7-dibromo-9,10-dimethoxy-9-methyl-10-p-tolyl-9,10-dihydro-phenanthrene (EM6)

4.52 g (113 mmol) of NaH as a 60% strength dispersion in mineral oil were placed in a dry apparatus, 40 ml of dry DMSO were added, 36.8 g (75.4 mmol) of 2,7-dibromo-10-methoxy-10-methyl-9-p-tolyl-9,10-dihydrophenanthren-9-ol in 100 ml of dry DMSO were subsequently added dropwise and the mixture was stirred at RT for 30 minutes. 7 ml (113 mmol) of MeI were then added dropwise over a period of 1 hour while cooling in ice and the mixture was stirred at RT for 1 hour. To work up the mixture, it was cooled to 5° C., 150 ml of 15% NH$_4$OH were added dropwise, the precipitate was filtered off with suction, washed twice with water and twice with MeOH. To purify it further, it was recrystallized four times from EtOH/toluene. This left 16.7 g (44%) of colorless crystals having a purity determined by RP-HPLC of 99.90%.

$^1$H-NMR (CDCl$_3$): [ppm]=7.67 (d, $^3J_{HH}$=8.4 Hz, 1 H), 7.63 (d, $^3J_{HH}$=8.4 Hz, 1 H), 7.57 (d, $^4J_{HH}$=2.0 Hz, 1 H), 7.53 (m, 2 H), 7.37 (br, s, 2 H), 7.28 (d, $^4J_{HH}$=2.0 Hz), 7.22 (br, s, 2 H), 2.82 (s, 3 H), 2.79 (s, 3 H), 2.42 (s, 3 H), 1.24 (s, 3 H).

A 4 Synthesis of DHP-OPV Monomers

A 4.1 Preparation of 2,7-bis[2-(4-bromophenyl)vinyl]-9,10-dibutyl-9,10-dimethoxy-9,10-dihydrophenanthrene (EM 7)

22.9 g (74.7 mmol) of diethyl 4-bromobenzylphosphonate were dissolved in 200 ml of DMF and admixed with 14.4 g (149 mmol) of NaO$^t$Bu at about 5° C. under protective gas. After stirring at 5° C. for 30 minutes, 13.9 g (34 mmol) of 9,10-dibutyl-9,10-dimethoxy-9,10-dihydrophenanthrene-2,7-dicarbaldehyde were added at a maximum temperature of 5° C. over a period of 15 minutes and the mixture was subsequently stirred at 5° C. for 1 hour. To work up the mixture, 50 ml of 4M HCl were added dropwise, the precipitate formed was filtered off with suction, washed with water and MeOH and dried. The solid was subsequently recrystallized three times from EtOH/toluene to give 21.1 g (87%) of the monomer having a purity determined by RP-HPLC of 99.8%.

$^1$H-NMR (CDCl$_3$): [ppm]=7.65 (m, 4 H), 7.47 (m, 6 H), 7.41 (d, $^3J_{HH}$=8.7 Hz, 4 H), 7.14 (d, $^3J_{HH}$=16.4 Hz, 2 H), 7.11 (d, $^3J_{HH}$=16.1 Hz, 2 H), 3.76 (s, 6 H); 2.17 (m, 2 H), 1.55 (m, 2 H), 1.18 (m, 6 H), 0.68 (m, 8 H).

Part B: Synthesis of Polymers Comprising Dihydrophenanthrene Units

The structures of the inventive monomers (EM) described and further monomers (M) for polymers according to the invention (P) and comparative polymers (C) are shown below. The synthesis of these compounds is reported above and in WO 03/020790. 9,10-Dibromoanthracene was purchased (Aldrich, 98%) and purified further by recrystallization from dioxane.

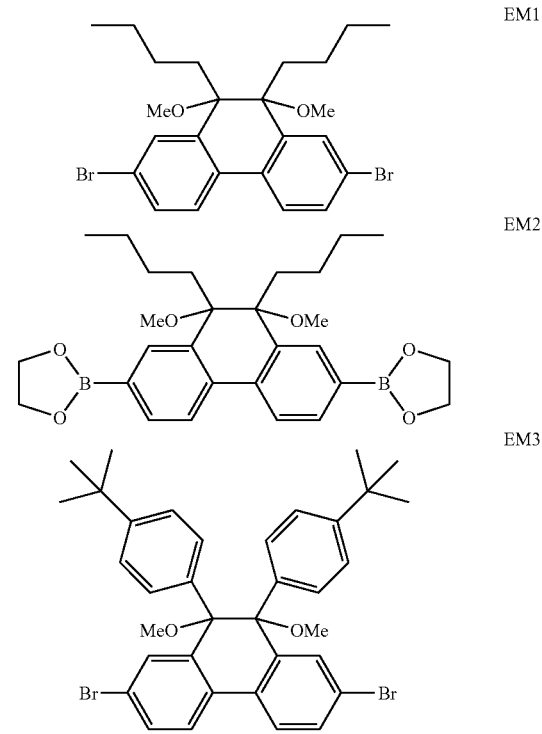

-continued

EM4
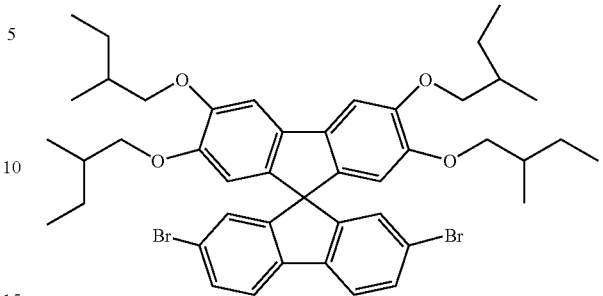

EM5
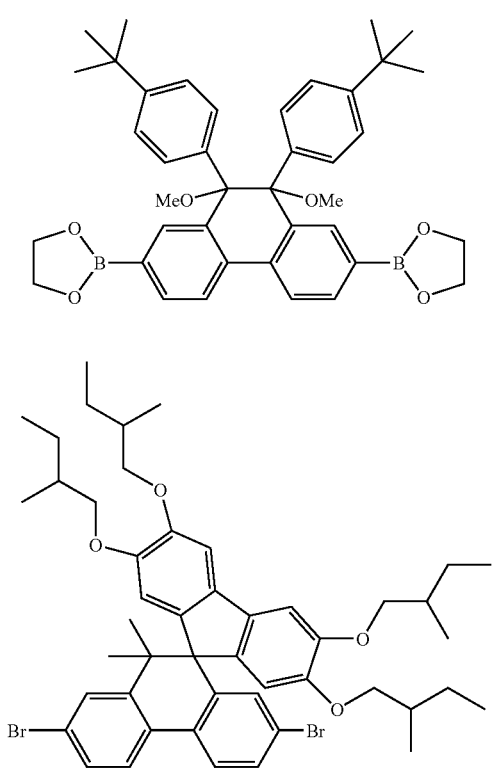

M2

M3
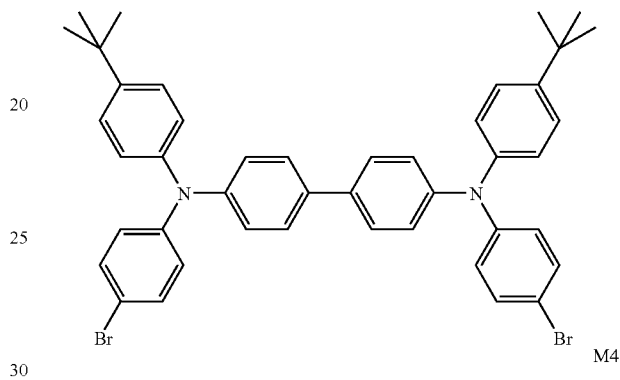

M4
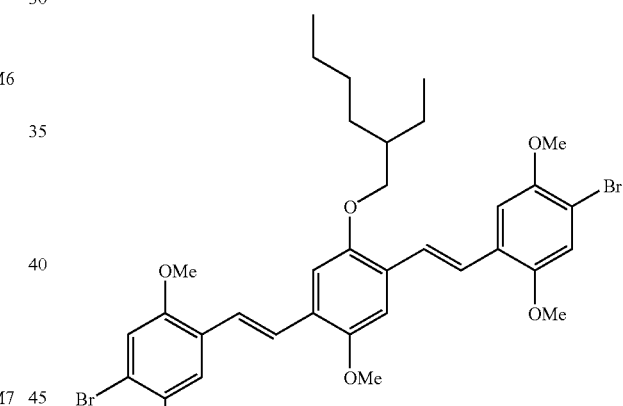

EM6

EM7

M1
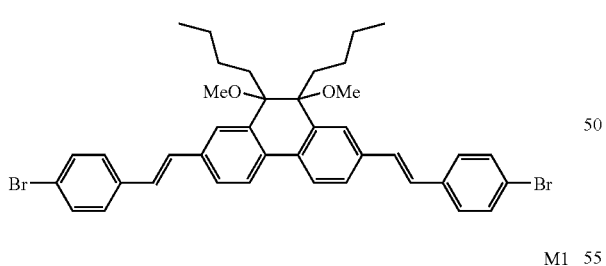

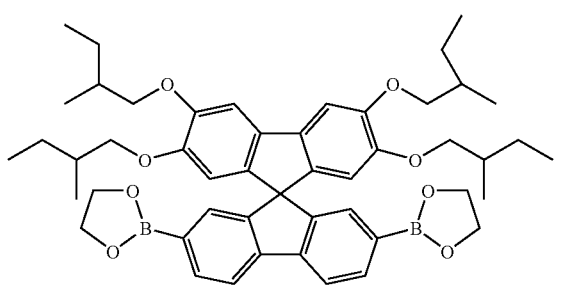

M5
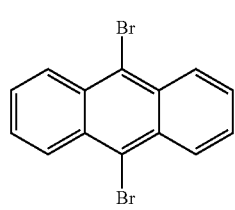

B 1: Synthesis of Polymer P3

Copolymerization of 50 mol % of 9,10-bis(t-butylphenyl)-9,10-dimethoxy-9,10-dihydrophenanthrene-2,7-bis(boronic acid ethylene glycol ester) (EM4), 20 mol % of 2,7-dibromo-9,10-bis(t-butylphenyl)-9,10-dimethoxy-9,10-dihydrophenanthrene (EM3), 10 mol % of N,N'-bis(4-bromophenyl)-N,N'-bis(4-tert-butylphenyl)benzidine (M3) and 20% of 1-(2-ethylhexyloxy)-4-methoxy-2,5-bis(4-bromo-2,5-dimethoxystyryl)benzene (M4):

1.2888 g (2.0 mmol) of EM4, 0.5300 g (0.8 mmol) of EM3, 0.3035 g (0.2 mmol) of M3, 0.5748 g (0.8 mmol) of M4, 2.0300 g (8.8 mmol) of $K_3PO_4.H_2O$, 6 ml of toluene, 19 ml of dioxane and 12.5 ml of water were degassed by passing argon through the mixture for 30 minutes. 3.65 mg (12 μmol) of tris-o-tolylphosphine and 0.45 mg (2 μmol) of palladium acetate were subsequently added under protective gas. The suspension was stirred vigorously under a blanket of argon at an internal temperature of 87° C. (gentle reflux). After 20 minutes, a further 15 ml of toluene were added because of the high viscosity. After 30 minutes, 12 mg of 3,4-bis(2-methylbutyloxy)benzeneboronic acid were added. After heating for a further 60 minutes, 20 mg of 3,4-bis(2-methylbutyloxy)bromobenzene were added and the mixture was refluxed for another 60 minutes.

The reaction solution was stirred with 5% strength aqueous sodium diethyldithiocarbamate trihydrate solution at 65° C. for 4 hours. The organic phase was washed three times with $H_2O$ and precipitated by introducing it dropwise into 200 ml of methanol. The polymer was dissolved in 120 ml of toluene, filtered through Celite, precipitated by means of 200 ml of MeOH, washed and dried to constant mass under reduced pressure. This gave 2.1 g (95%) of the polymer P3 as a yellowish solid.

$^1$H NMR (CDCl$_3$): [ppm] 8.1-6.8 (m, 12.8 H, DHP, TAD arom.); 6.3 (br. s, 1.4 H, DHP); 4.1-3.6 (3×m, 3.4 H, OCH$_2$, OCH$_3$); 3.0-2.5 (3×m, 4.2 H, OCH$_3$ DHP); 1.9-0.7 (m, 17.4 alkyl H, including t-butyl at 1.3).

GPC: THF; 1 ml/min, PLgel 10 μm mixed-B 2×300×7.5 mm$^2$, 35° C., RI detection: $M_w$=207 000 g/mol, $M_n$=58 000 g/mol.

B 2: Synthesis of Polymer P4

Polymerization of 2,7-dibromo-9,10-bis(t-butylphenyl)-9,10-dimethoxy-9,10-dihydrophenanthrene (EM3) by the Yamamoto method (as described in WO 04/022626):

Preparation of the Catalyst Solution:

Manganese (0.11 g, 2 mmol) was mixed with NiBr$_2$ (200 mg, 0.9 mmol) dissolved in 5 ml of DMF at room temperature. The ligand solution, comprising 150 mg (0.96 mmol) of bipyridine and 0.12 ml (1.0 mmol) of COD dissolved in 15 ml of toluene, was slowly added. After 5-10 minutes, the solution had become deep violet. The mixture was stirred vigorously at room temperature for 12 hours.

Manganese (350 mg, 6.4 mmol) and the catalyst solution (2 ml) were stirred at 50° C. under argon for 10 minutes. The mixture remained a stable violet color. The monomer (1.06 g, 1.6 mmol) EM3 was then added as a solution in 16 ml of toluene; this resulted in the reaction mixture turning red and the mixture was subsequently stirred at 50° C. for 5 days. The mixture was cooled to room temperature, diluted with 10 ml of toluene and filtered through Celite. The organic phase was washed three times with HCl (50 ml) and with $H_2O$ and precipitated by introducing it dropwise into 500 ml of methanol. The polymer was dissolved in 50 ml of toluene, precipitated by means of 500 ml of MeOH, washed and dried under reduced pressure. The polymer was extracted with a mixture of THF/MeOH 1:1 in a Soxhlet extractor for 48 hours, dissolved in 50 ml of toluene and reprecipitated once more in 500 ml of methanol, filtered off with suction and dried to constant mass. This gave 0.6 g (75%) of P4 as a pale yellow solid.

$^1$H NMR (CDCl$_3$): [ppm] 8.1-6.9 (m, 12 H); 6.7 (br s, 2 H); 2.9-2.5 (m, 6 H, OCH$_3$); 1.4-1.1 (m, 18 alkyl H). GPC: THF; 1 ml/min, Plgel 10 μm Mixed-B 2×300×7.5 mm$^2$, 35° C., RI detection: $M_w$=135 000 g/mol, $M_n$=30 000 g/mol.

Further comonomers were incorporated in the same way and further red-, green- and blue-emitting polymers were thus prepared. Comparative polymers (hereinafter denoted by C) which comprise spirobifluorene units instead of units of the formula (I) were likewise synthesized.

All these polymers were also examined for use in PLEDs. These PLEDs were in each case two-layer systems, i.e. substrate//ITO//PEDOT//polymer//cathode. PEDOT is a polythiophene derivative (from H. C. Stark, Goslar). Ba/Ag used as cathode in all cases. The way in which PLEDs can be produced has been described comprehensively in WO 04/037887 and the references cited therein.

The most important device properties of the polymers according to the invention (color, efficiency, operating voltage, life) are shown in Table 1 and are compared with the comparative polymers which do not comprise any units of the formula (I).

TABLE 1

Properties of poly(dihydrophenanthrenes) and comparison of these with poly(spirofluorenes); all polymers were prepared by means of a Suzuki polymerization.

| | Proportion of monomers in the polymerization [%] | | | | | GPC* | | Electroluminescence | | | |
|---|---|---|---|---|---|---|---|---|---|---|---|
| | | | | | | $M_W$/ g/mol | $M_N$/ g/mol | □$_{max}$ [nm] | Max. Eff. [Cd/A] | Voltage at 100 Cd/m$^2$ [V] | CIE coordinates | Life at 100 Cd/m$^2$ [h] |

Polymers according to the invention comprising dihydrophenanthrene units

| | | | | | | $M_W$/ g/mol | $M_N$/ g/mol | □$_{max}$ [nm] | Max. Eff. [Cd/A] | Voltage at 100 Cd/m$^2$ [V] | CIE coordinates | Life at 100 Cd/m$^2$ [h] |
|---|---|---|---|---|---|---|---|---|---|---|---|---|
| P1 | 50 (EM4) | 40 (EM3) | 10 (M3) | | | 1476000 | 355000 | 461 | 4.40 | 4.0 | 0.16/0.15 | 1700 |
| P2 | 50 (EM4) | 30 (EM3) | 10 (M3) | 10 (M5) | | 194000 | 67800 | 467 | 2.09 | 4.1 | 0.16/0.18 | 1900 |
| P3 | 50 (EM4) | 20 (EM3) | 10 (M3) | | 20 (M4) | 360000 | 43000 | 522 | 12.0 | 3.3 | 0.30/0.57 | 15000 |
| P4 | 10 (EM7) | 50 (M1) | 30 (M2) | 10 (M3) | | 419000 | 132000 | 488 | 4.2 | 4.0 | 0.18/0.31 | 2200 |
| P5 | 30 (EM7) | 50 (M1) | 10 (M2) | 10 (M3) | | 203000 | 34000 | 489 | 3.1 | 4.3 | 0.18/0.31 | 3600 |

Comparative polymers comprising spirobifluorene units, as described in WO 03/020790

| | M1 | M2 | M3 | M5 | M4 | $M_W$ (·1000 g/mol) | $M_N$ (·1000 g/mol) | □$_{max}$ [nm] | Max. Eff. [Cd/A] | Voltage at 100 Cd/m$^2$ [V] | CIE coordinates | Life at 100 Cd/m$^2$ [h] |
|---|---|---|---|---|---|---|---|---|---|---|---|---|
| C1 | 50 | 40 | 10 | | | 523000 | 132000 | 454 | 3.30 | 4.4 | 0.16/0.17 | 1250 |
| C2 | 50 | 30 | 10 | 10 | | 306000 | 80500 | 457 | 2.99 | 4.4 | 0.16/0.19 | 1500 |
| C3 | 50 | 20 | 10 | | 20 | 303000 | 64500 | 520 | 10.5 | 3.4 | 0.29/0.56 | 5000 |

*GPC measurements: THF; 1 ml/min, Pigel 10 μm Mixed-B 2 × 300 × 7.5 mm$^2$, 35° C., RI detection was calibrated against polystyrene..

The invention claimed is:

1. A polymer, characterized in that it comprises at least 1 mol % of units of the formula (I),

FORMULA (I)

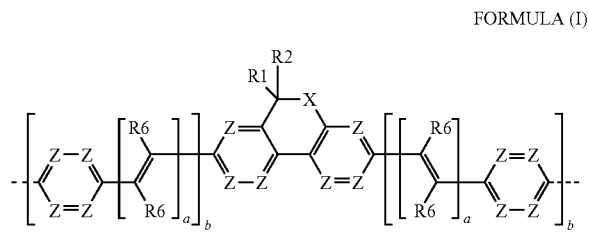

where the symbols and indices used have the following meanings:

X is identical or different on each occurrence and is in each case C(R3)(R4) or N(R3);

Z is identical or different on each occurrence and is in each case C(R5) or N;

R1, R2, R3, R4 are identical or different on each occurrence and are in each case fluorine, chlorine, bromine, iodine, CN, $N(R6)_2$, $Si(R6)_3$ or $B(R6)_2$, a straight-chain, branched or cyclic alkyl or alkoxy chain having from 1 to 22 carbon atoms in which one or more nonadjacent carbon atoms may also be replaced by NR6, O, S, O—CO—O, CONR6, $Si(R6)_2$, where one or more H atoms may also be replaced by fluorine, an aryl, heteroaryl or aryloxy group having from 5 to 40 carbon atoms in which one or more carbon atoms may also be replaced by O, S or N and which may also be substituted by one or more nonaromatic radicals R1, with two or more of the radicals R1 to R4 also being able to be joined to form a ring system; with the proviso that two substituents on one carbon atom are not at the same time an alkoxy or aryloxy side chain and that all substituents R1 to R4 are not at the same time H or not at the same time a methyl group;

R5 is identical or different on each occurrence and is in each case H, F, CN, $N(R6)_2$ or $B(R6)_2$, a straight-chain, branched or cyclic alkyl or alkoxy chain having from 1 to 22 carbon atoms in which one or more nonadjacent carbon atoms may also be replaced by O, S, CO—O, O—CO—O, CONR6, $Si(R6)_2$, where one or more H atoms may also be replaced by fluorine, an aryl, heteroaryl or aryloxy group having from 5 to 40 carbon atoms in which one or more carbon atoms may also be replaced by O, S or N and which may also be substituted by one or more nonaromatic radicals R5; with a plurality of radicals R5 or R5 together with R1 to R4 also being able to form a ring system;

R6 is identical or different on each occurrence and is in each case H, a straight-chain, branched or cyclic alkyl chain having from 1 to 22 carbon atoms in which one or more nonadjacent carbon atoms may also be replaced by O, S, CO—O, O—CO—O, where one or more H atoms may also be replaced by fluorine, an aryl group having from 5 to 40 carbon atoms in which one or more carbon atoms may also be replaced by O, S or N and which may also be substituted by one or more nonaromatic radicals R6;

a is identical or different on each occurrence and is in each case 0 or 1;

b is identical or different on each occurrence and is in each case 1 or 2;

with the proviso that poly(arylene-vinylene) compounds in which one arylene unit is a 9,10-dialkyl-9,10-dihydrophenanthrene are excluded from the invention; and the bond shown as a broken line indicates the linkage in the polymer.

2. The polymer as claimed in claim 1, wherein X is C(R3)(R4), as shown in formula (Ia):

FORMULA (Ia)

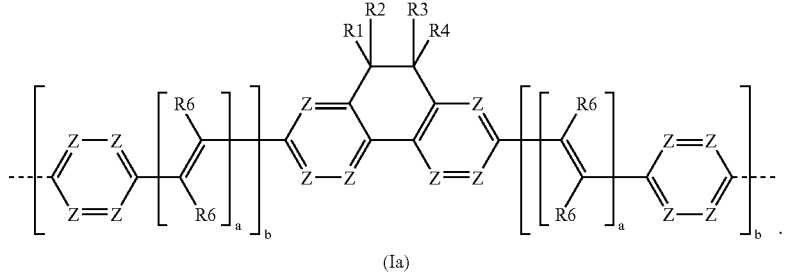

(Ia)

3. The polymer as claimed in claim 2, wherein Z is C(R5), as shown in formula (Ib):

FORMULA (Ib)

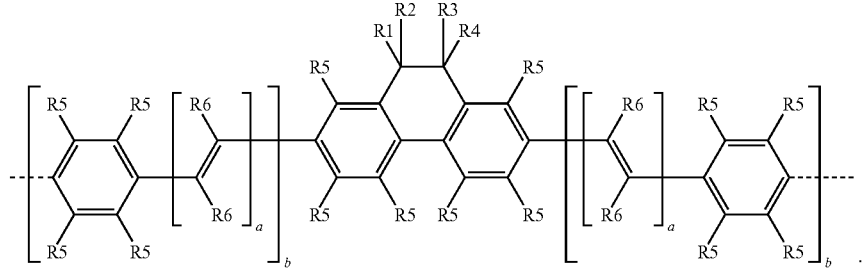

(Ib)

4. The polymer as claimed in claim 1, wherein said polymer is conjugated.

5. The polymer as claimed in claim 1, wherein said polymer further comprises additional units which significantly improve the hole injection and/or transport properties.

6. The polymer as claimed in claim 5, wherein the units having hole transport properties are selected from among the structural elements triarylamine derivatives, benzidine derivatives, tetraarylene-para-phenylenediamine derivatives, phenothiazine derivatives, phenoxazine derivatives, dihydrophenazine derivatives, thianthrene derivatives, dibenzo-p-dioxin derivatives, phenoxathiine derivatives, carbazole derivatives, azulene derivatives, thiophene derivatives, pyrrole derivatives, furan derivatives and further O—, S— or N containing heterocycles having a high HOMO.

7. The polymer as claimed in claim 1, wherein said polymer further comprises additional units which significantly improve the electron injection and/or transport properties.

8. The polymer as claimed in claim 7, wherein the units having electron transport properties are selected from the structural elements pyridine derivatives, pyrimidine derivatives, pyridazine derivatives, pyrazine derivatives, anthracene derivatives, triarylboranes, oxadiazole derivatives, quinoline derivatives, quinoxaline derivatives, phenazine derivatives, arylboranes and further O—, S— or N containing heterocycles having a low LUMO.

9. The polymer as claimed in claim 1, wherein said polymer comprises units which alter the emission characteristics so that electrophosphorescence can be obtained instead of electrofluorescence.

10. The polymer as claimed in claim 9, wherein the units which make a transfer from singlet excitons to triplet excitons possible and emit light with high efficiency from the triplet state even at room temperature are selected from among compounds which comprise heavy atoms having an atomic number of more than 36.

11. The polymer as claimed in claim 10, wherein the heavy atoms are selected from among the elements of groups 8 to 10.

12. The polymer as claimed in claim 1, wherein said polymer comprises additional units which aid the transition from the singlet state to the triplet state.

13. The polymer as claimed in claim 12, wherein the structural units which aid the transition from the singlet state to the triplet state are selected from the group consisting of carbazoles and bridged carbazole dimers.

14. The polymer as claimed in claim 1, wherein further comprising units which influence the morphology or the emission color of the resulting polymer and are selected from among aromatic structures having from 6 to 40 carbon atoms and stilbene, bisstyrylarylene and tolane derivatives, which may each be substituted by one or more nonaromatic radicals R1.

15. The polymer as claimed in claim 14, whereint the structural elements described are selected from among 1,4-phenylene, 1,4-naphthylene, 1,4- or 9,10-anthracenylene, 1,6- or 2,7- or 4,9-pyrenylene, 3,9- or 3,10 perylenylene, 2,7- or 3,6-phenanthrenylene, 4,4'-biphenylylene, 4,4" terphenylylene, 4,4'-bi-1,1'-naphthylylene, 4,5-dihydropyrene, 4,5,9, 10 tetrahydropyrene, fluorene, spirobifluorene, 5,7-dihydrodibenzooxepin, cis- or trans-indenofluorene, 4,4'-stilbene, 4,4" bisstyrylarylene and 4,4'-tolane derivatives.

16. The polymer as claimed in claim 1, wherein an average of at least 2 nonaromatic carbon atoms are present in the substituents per repeating unit.

17. The polymer as claimed in claim 1, wherein the substituents of the repeating units contain less than or equal to 12 carbon atoms in a linear chain.

18. The polymer as claimed in claim 1, wherein the following applies to the symbols in the formula (I):
X is C(R3)(R4) on each occurrence;
Z is CH on each occurrence;
R1, R3 are identical or different on each occurrence and are each a straight-chain or branched alkyl chain having from 1 to 8 carbon atoms or an aryl group having from 5 to 10 carbon atoms, in which one or more carbon atoms may also be replaced by N, S and/or O and which may also be substituted by one or more nonaromatic radicals R5;
R2, R4 are identical or different on each occurrence and are each a straight-chain or branched alkoxy chain having from 1 to 8 carbon atoms;
a is 1 on each occurrence if the units of the formula (I) are used as emitters;
b is 1 on each occurrence if the units of the formula (I) are used as emitters.

19. The polymer as claimed in claim 1, wherein the structural units of the formula (I) are selected from among units of the formulae (LXXIX) to (CVI).

20. The polymer as claimed in claim 1, wherein the structure units of the formula are of the fomulae (CV), formula (CV)

where R is a straight-chain or branched alkyl chain having from 1 to 8 carbon atoms.

21. A mixture comprising one or more polymers as claimed in claim 1.

22. A solution comprising one or more polymers as claimed in claim 1 in one or more solvents.

23. An organic electronic device, comprising a polymer as claimed in claim 1.

24. An electroluminescence material, comprising a polymer as claimed in claim 1.

25. An organic electronic device comprising one or more active layers, wherein at least one of these active layers comprises one or more polymers as claimed in claim 1.

26. The organic electronic device as claimed in claim 25, wherein it is a polymeric light-emitting diode (PLED), an organic integrated circuit (O-IC), an organic field effect transistor (OFET), an organic thin film transistor (OTFT), an organic solar cell (O—SC), an organic photoreceptor or an organic laser diode (O-laser).

* * * * *